(12) United States Patent
Yanagisawa

(10) Patent No.: US 10,919,758 B2
(45) Date of Patent: Feb. 16, 2021

(54) PHYSICAL QUANTITY SENSOR, INERTIAL MEASUREMENT UNIT, ELECTRONIC APPARATUS, PORTABLE ELECTRONIC APPARATUS, AND VEHICLE

(71) Applicant: Seiko Epson Corporation, Tokyo (JP)

(72) Inventor: Yoshinao Yanagisawa, Minowa (JP)

(73) Assignee: Seiko Epson Corporation

( * ) Notice: Subject to any disclaimer, the term of this patent is extended or adjusted under 35 U.S.C. 154(b) by 78 days.

(21) Appl. No.: 16/257,516

(22) Filed: Jan. 25, 2019

(65) Prior Publication Data

US 2019/0233279 A1 Aug. 1, 2019

(30) Foreign Application Priority Data

Jan. 26, 2018 (JP) ................ 2018-011309

(51) Int. Cl.
| | |
|---|---|
| *B81C 1/00* | (2006.01) |
| *B81B 7/00* | (2006.01) |
| *H01L 23/04* | (2006.01) |
| *H01L 23/00* | (2006.01) |
| *G01P 15/125* | (2006.01) |
| *G01L 1/14* | (2006.01) |
| *G01P 1/02* | (2006.01) |
| *G01P 15/08* | (2006.01) |

(Continued)

(52) U.S. Cl.
CPC .......... *B81C 1/0023* (2013.01); *B81B 7/0048* (2013.01); *G01L 1/144* (2013.01); *G01P 1/023* (2013.01); *G01P 15/0802* (2013.01); *G01P 15/125* (2013.01); *G01P 15/18* (2013.01); *H01L 23/04* (2013.01); *H01L 23/055* (2013.01); *H01L 24/49* (2013.01); *B81B 2201/0235* (2013.01); *B81B 2201/0242* (2013.01); *H01L 2224/48091* (2013.01); *H01L 2224/48137* (2013.01); *H01L 2224/48227* (2013.01); *H01L 2224/73265* (2013.01); *H01L 2924/00014* (2013.01)

(58) Field of Classification Search
CPC ...... B81C 1/0023; B81B 7/0064; G01P 1/023
See application file for complete search history.

(56) References Cited

U.S. PATENT DOCUMENTS

| 9,365,414 B2 * | 6/2016 | Bowles ............... B81B 7/02 |
| 2010/0216282 A1 * | 8/2010 | Wang .............. G01R 33/1269 438/118 |

(Continued)

FOREIGN PATENT DOCUMENTS

| JP | 2007-139505 A | 6/2007 |
| JP | 2008-288492 A | 11/2008 |
| JP | 2011-120170 A | 6/2011 |

(Continued)

*Primary Examiner* — Mark V Prenty
(74) *Attorney, Agent, or Firm* — Harness, Dickey & Pierce, P.L.C.

(57) ABSTRACT

A physical quantity sensor includes a substrate, an acceleration sensor mounted on the substrate, an integrated circuit mounted on the substrate and stacked with the acceleration sensor, and serial communication wirings provided to the substrate. In a plan view of the acceleration sensor element, a bonding wire connecting the acceleration sensor element to the integrated circuit is disposed on an opposite side to the serial communication wirings with respect to a virtual central line of the acceleration sensor element.

20 Claims, 23 Drawing Sheets

(51) Int. Cl.
*H01L 23/055* (2006.01)
*G01P 15/18* (2013.01)

(56) References Cited

U.S. PATENT DOCUMENTS

2011/0135122 A1   6/2011  Awamura et al.
2012/0112368 A1   5/2012  Gorai et al.

FOREIGN PATENT DOCUMENTS

| JP | 2015-102404 A | 6/2015 |
| JP | 2019-035589 | 3/2019 |
| WO | WO-2011-018973 A1 | 2/2011 |

\* cited by examiner

PHYSICAL QUANTITY SENSOR, INERTIAL MEASUREMENT UNIT, ELECTRONIC APPARATUS, PORTABLE ELECTRONIC APPARATUS, AND VEHICLE

BACKGROUND

1. Technical Field

The present invention relates to a physical quantity sensor, an inertial measurement unit, an electronic apparatus, a portable electronic apparatus, and a vehicle.

2. Related Art

In recent years, a physical quantity sensor which is manufactured by using a silicon micro electromechanical system (MEMS) technique has been developed. As such a physical quantity sensor, for example, JP-A-2007-139505 discloses an electrostatic capacitance type physical quantity sensor (dynamic quantity sensor) which includes a sensor element having movable electrodes and fixed electrodes disposed to face each other in a comb shape. The sensor measures a physical quantity on the basis of electrostatic capacitance generated between both the electrodes.

Regarding a method of mounting a sensor element in a package, for example, JP-A-2008-288492 discloses a structure in which a semiconductor chip (microphone chip) and an LSI chip are mounted on a bottom surface of a depression of a semiconductor package.

However, in a case where a physical quantity (acceleration or angular velocity) sensor element and a semiconductor circuit (IC) are mounted on a bottom surface of a depression of a package, there is a problem in that broad noise, that is, so-called residual noise (noise density) is mixed into the signal output from the physical quantity sensor element due to the influence of noise caused by electrical interface between a wire via which the physical quantity sensor element is connected to the semiconductor circuit and a wiring for serial communication SPI disposed inside the package.

SUMMARY

An advantage of some aspects of the invention is to solve at least a part of the problems described above, and the invention can be implemented as the following aspects or application examples.

APPLICATION EXAMPLE 1

A physical quantity sensor according to this application example includes a sensor element; a semiconductor circuit; and a substrate on which the sensor element and the semiconductor circuit are mounted, and serial communication wirings are provided, in which the sensor element and the semiconductor circuit are stacked on each other, and in which, in a plan view of the sensor element, an electrical connection portion connecting the sensor element to the semiconductor circuit is disposed on an opposite side to the serial communication wirings with respect to a virtual central line passing through the center of the sensor element.

According to the physical quantity sensor according to this application example, since the electrical connection portion connecting the sensor element to the semiconductor circuit is disposed on an opposite side to the serial communication wirings with respect to the virtual central line passing through the center of the sensor element, the electrical connection portion and the serial communication wirings hardly electrically interfere with each other. Thus, residual noise is hardly mixed into a signal output from the sensor element, and thus it is possible to reduce deterioration in sensor measurement characteristics of the physical quantity sensor.

APPLICATION EXAMPLE 2

In the physical quantity sensor according to the application example, it is preferable that, in the plan view, a GND wiring is provided on a side on which the electrical connection portion is disposed.

According to this application example, since the GND wiring is disposed on the side on which the electrical connection portion is disposed, the GND wiring is disposed between the electrical connection portion and the serial communication wirings, and thus the electrical connection portion and the serial communication wirings electrically interfere with each other even less. Thus, it is possible to further reduce deterioration in sensor measurement characteristics of the physical quantity sensor.

APPLICATION EXAMPLE 3

In the physical quantity sensor according to the application example, it is preferable that the serial communication wirings include an MISO wiring, an MOSI wiring, and an SCLK wiring.

According to this application example, since the serial communication wirings include an MISO wiring, an MOSI wiring, and an SCLK wiring, residual noise caused by electrical interference with the electrical connection portion is hardly mixed, and thus it is possible to obtain highly accurate sensor measurement characteristics.

APPLICATION EXAMPLE 4

In the physical quantity sensor according to the application example, it is preferable that the serial communication wirings are electrically connected to terminals provided on an opposite surface of the substrate via conductors filling through-holes penetrating through the substrate.

According to this application example, since the serial communication wirings are electrically connected to terminals provided on an opposite surface of the substrate via conductors filling through-holes penetrating through the substrate, it is possible to reduce the influence of noise from the outside. A lead wire is not necessary, and thus it is possible to miniaturize the physical quantity sensor.

APPLICATION EXAMPLE 5

In the physical quantity sensor according to the application example, it is preferable that the sensor element and the semiconductor circuit are connected to each other through flip chip packaging.

According to this application example, since the sensor element and the semiconductor circuit are connected to each other through flip chip packaging, the electrical connection portion and the serial communication wirings electrically interfere with each other even less than in wire connection. Thus, it is possible to further reduce deterioration in sensor measurement characteristics of the physical quantity sensor.

APPLICATION EXAMPLE 6

It is preferable that the physical quantity sensor according to the application example further includes a GND solid pattern that is provided to be separated from a surface of the substrate on which the sensor element and the semiconductor circuit are mounted.

According to the physical quantity sensor according to this application example, since the GND solid pattern is provided to be separated from a surface of the substrate on which the sensor element and the semiconductor circuit are mounted, residual stress caused by a difference between linear expansion coefficients of the GND solid pattern and the sensor element hardly propagates to the sensor element, and thus it is possible to reduce temperature hysteresis caused by the residual stress.

APPLICATION EXAMPLE 7

In the physical quantity sensor according to the application example, it is preferable that the GND solid pattern is disposed to overlap the sensor element in a plan view from a direction in which the sensor element overlaps the semiconductor circuit.

According to this application example, since the GND solid pattern is disposed to overlap the sensor element, radiation noise from the outside can be blocked with the GND solid pattern, and thus it is possible to reduce the influence of radiation noise on the sensor element.

APPLICATION EXAMPLE 8

In the physical quantity sensor according to the application example, it is preferable that the substrate is a stacked substrate in which a plurality of substrates are stacked on each other.

According to this application example, since a plurality of routing patterns of wirings (metallized) can be provided between stacked substrates, a complex wiring can be disposed without increasing a substrate size in a plan view.

APPLICATION EXAMPLE 9

In the physical quantity sensor according to the application example, it is preferable that the number of substrates stacked on each other is three.

According to this application example, there are two inter-layers between the substrates, and thus a more complex wiring can be disposed.

APPLICATION EXAMPLE 10

It is preferable that the physical quantity sensor according to the application example further includes an annular substrate that is stacked on the surface of the substrate on which the sensor element and the semiconductor circuit are mounted, so as to inwardly surround the sensor element and the semiconductor circuit; and a conductive lid that seals an opening of a recessed portion such that the recessed portion formed by the substrate and the annular substrate is a closed space.

According to this application example, the sensor element and the semiconductor circuit are accommodated in the closed space provided among the substrate, the annular substrate, and the lid, and can thus be protected from an external atmosphere, so that it is possible to provide a high performance physical quantity sensor.

APPLICATION EXAMPLE 11

In the physical quantity sensor according to the application example, it is preferable that the lid and the GND solid pattern are electrically connected to each other via conductive layers formed in castellations provided on side surfaces of the substrate and the annular substrate, or conductors filling holes penetrating through the annular substrate.

According to this application example, since the conductive lid and the GND solid pattern are electrically connected to each other via the conductive layer or the conductor, radiation noise from the container outside which exerts the influence on the sensor element from the lid side or the substrate side of a container configured with the lid, the annular substrate, and the lid can be blocked with the lid and the GND solid pattern, and thus it is possible to further reduce the influence of radiation noise on the sensor element.

APPLICATION EXAMPLE 12

In the physical quantity sensor according to the application example, it is preferable that, among a plurality of wirings formed on the substrate, a width of an analog wiring is larger than a width of a signal wiring.

According to this application example, since the width of the analog wiring is larger than the width of the signal wiring, impedance of the analog wiring can be reduced, and thus it is possible to reduce the influence of radiation noise from the container outside.

APPLICATION EXAMPLE 13

In the physical quantity sensor according to the application example, it is preferable that, in a case where the width of the analog wiring is indicated by L1, and the width of the signal wiring is indicated by L2, a relationship of $L1/L2 \geq 2$ is satisfied.

According to this application example, the width of the analog wiring is twice or more the width of the signal wiring, and thus it is possible to reduce the influence of radiation noise from the container outside.

APPLICATION EXAMPLE 14

In the physical quantity sensor according to the application example, it is preferable that the sensor element is an acceleration sensor element.

According to this application example, residual noise is made to be hardly mixed into a signal output from the acceleration sensor element, and thus it is possible to acquire a highly accurate according to signal.

APPLICATION EXAMPLE 15

An inertial measurement unit according to this application example includes the physical quantity sensor according to the application example, an angular velocity sensor, and a control section that controls the physical quantity sensor and the angular velocity sensor.

According to this application example, it is possible to provide the inertial measurement unit with higher accuracy by using the physical quantity sensor in which residual noise is hardly mixed into a signal output from the sensor element, and thus deterioration in sensor measurement characteristics is reduced.

APPLICATION EXAMPLE 16

An electronic apparatus according to this application example includes the physical quantity sensor according to any one of the application examples; a control section that performs control on the basis of a measurement signal output from the physical quantity sensor; and a correction section that corrects the measurement signal.

According to this application example, it is possible to provide the electronic apparatus with higher accuracy by using the physical quantity sensor in which residual noise is hardly mixed into a signal output from the sensor element, and thus deterioration in sensor measurement characteristics is reduced.

APPLICATION EXAMPLE 17

A portable electronic apparatus according to this application example includes the physical quantity sensor according to any one of the application examples; a case in which the physical quantity sensor is accommodated; a processing section that is accommodated in the case, and processes output data from the physical quantity sensor; a display section that is accommodated in the case; and a light-transmissive cover that closes an opening of the case.

According to this application example, it is possible to provide the portable electronic apparatus with higher accuracy by using the physical quantity sensor in which residual noise is hardly mixed into a signal output from the sensor element, and thus deterioration in sensor measurement characteristics is reduced.

APPLICATION EXAMPLE 18

A vehicle according to this application example includes the physical quantity sensor according to any one of the application examples; and a posture control section that performs posture control on the basis of a measurement signal output from the physical quantity sensor.

According to this application example, since posture control is performed a highly accurate signal output from the physical quantity sensor in which residual noise is hardly mixed into a signal output from the sensor element, and thus deterioration in sensor measurement characteristics is reduced, it is possible to provide the vehicle of which posture control characteristics are highly accurate.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a physical quantity sensor, an inertial measurement unit, an electronic apparatus, a portable electronic apparatus, and a vehicle will be described in detail on the basis of embodiments illustrated in the accompanying drawings. The embodiments described below do not limit the scope of the invention in the appended claims. All configurations described in the present embodiments are not essential to the invention.

First Embodiment

Physical Quantity Sensor 1

Figure 1:
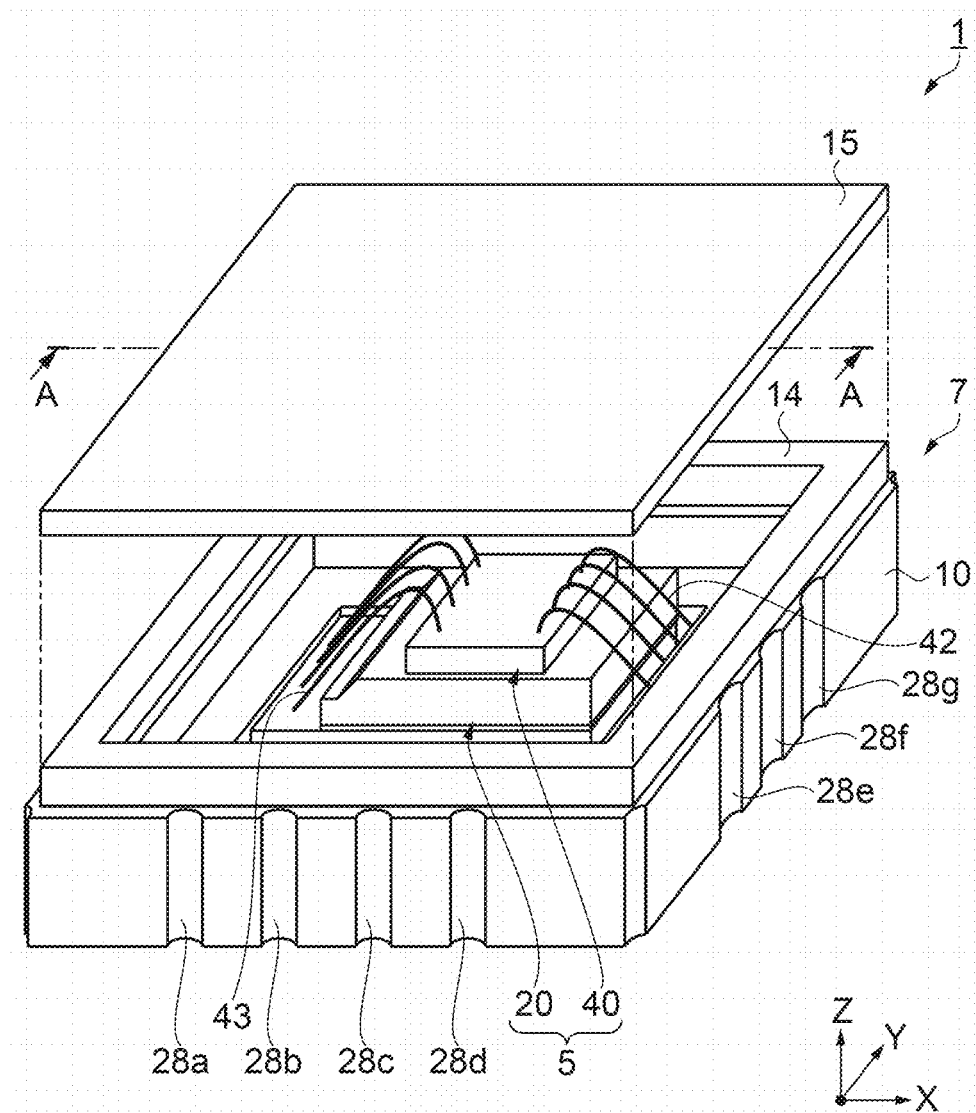
FIG. 1 is a perspective view illustrating a schematic configuration of a physical quantity sensor according to a first embodiment.
Figure 2:
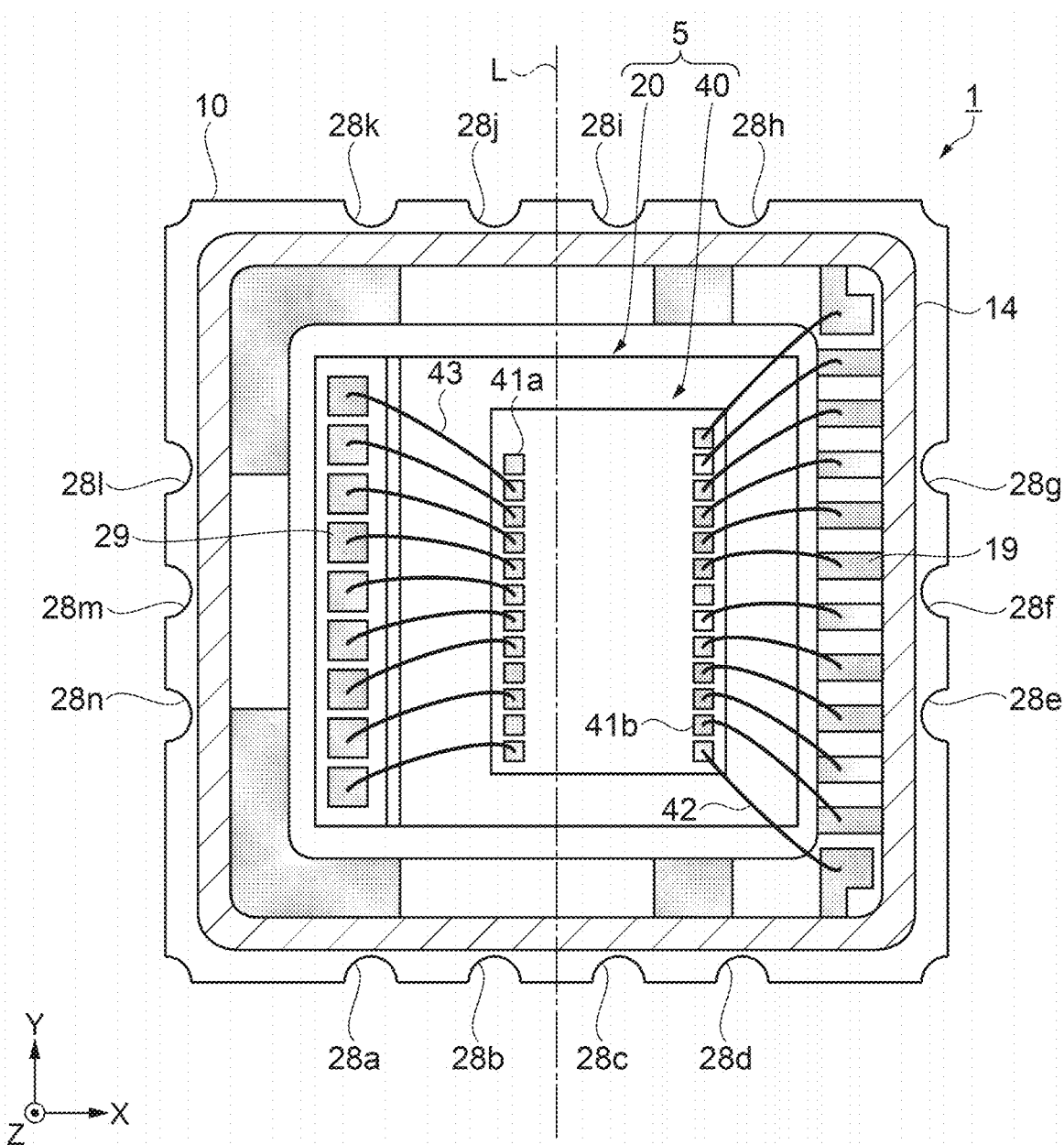
FIG. 2 is a plan view illustrating a schematic configuration of the physical quantity sensor.
Figure 3:
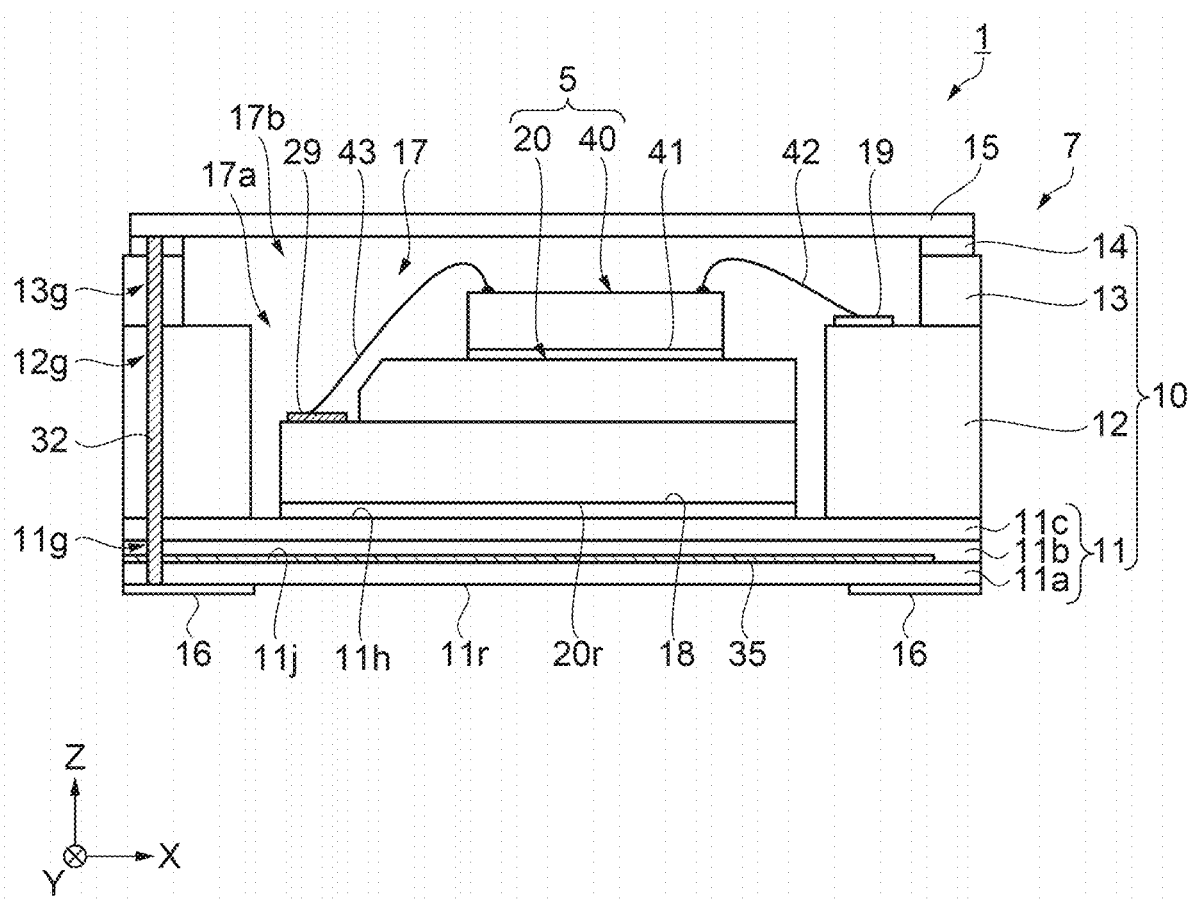
FIG. 3 is a sectional view taken along the line A-A in FIG. 1, illustrating a schematic configuration of the physical quantity sensor.
Figure 4:
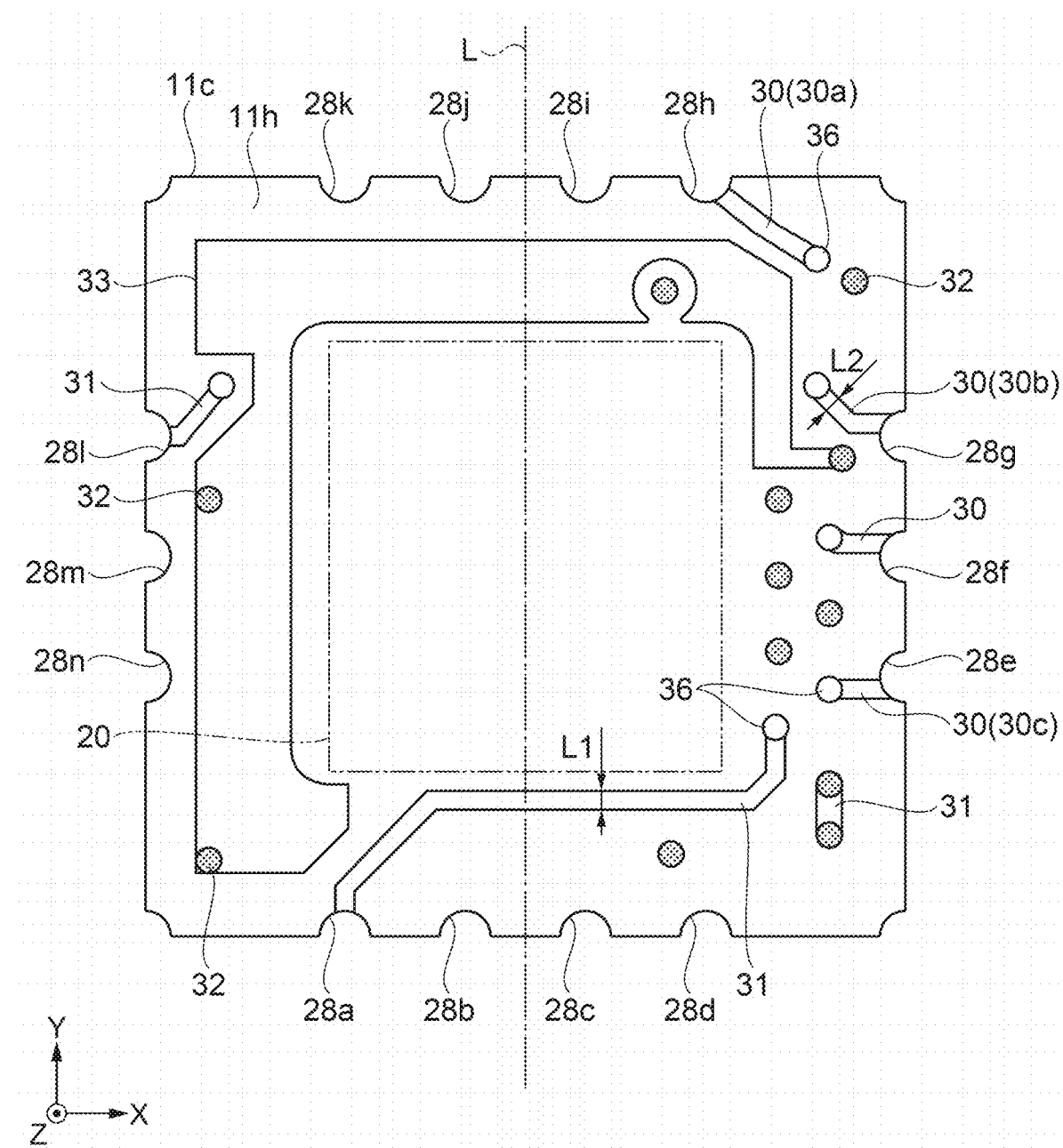
FIG. 4 is a plan view illustrating a schematic configuration of a wiring provided on a substrate.
Figure 5:
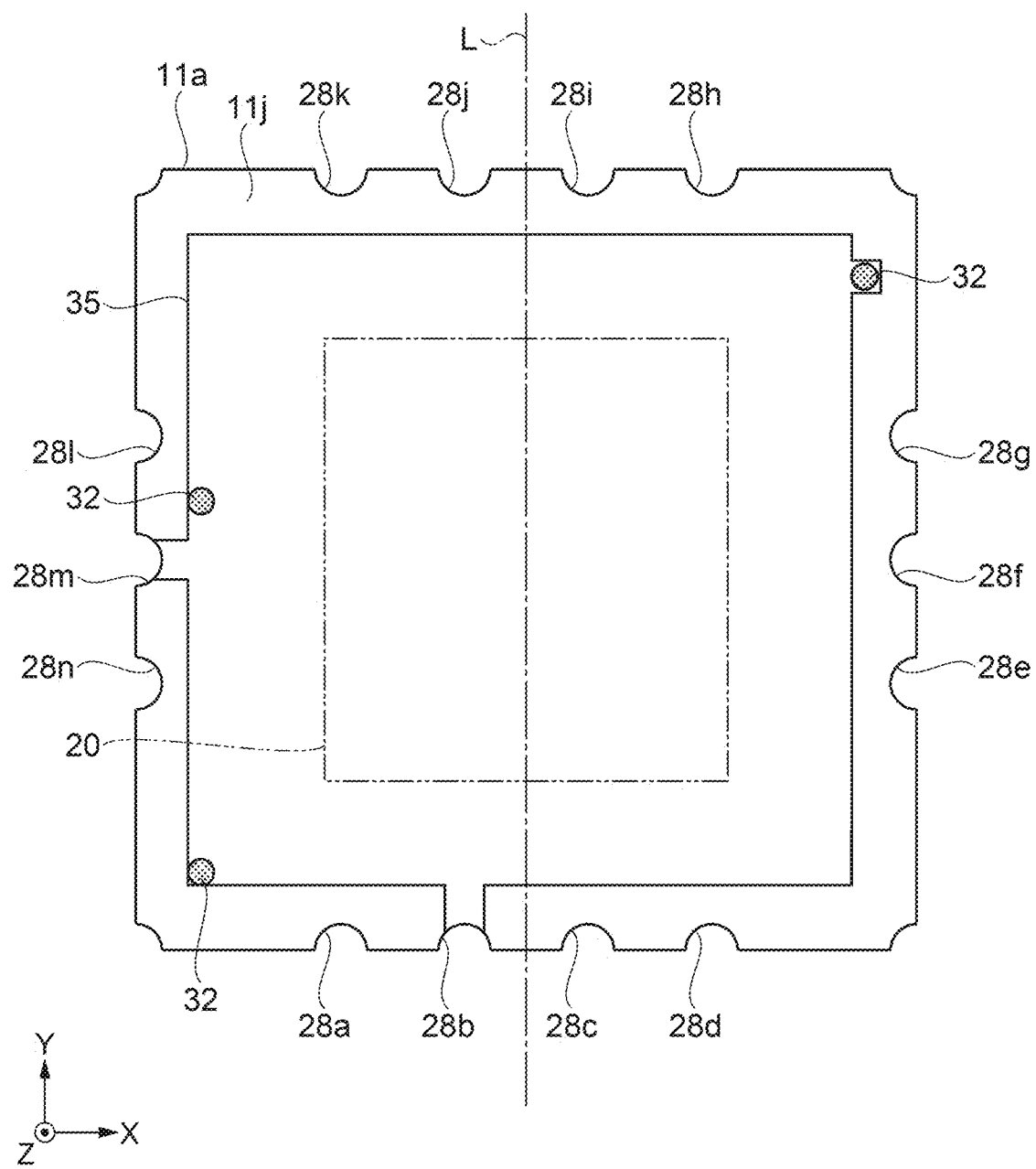
FIG. 5 is a plan view illustrating a schematic configuration of a GND solid pattern provided on the substrate.

First, a physical quantity sensor according to a first embodiment will be described with reference to FIGS. 1, 2, 3, 4, and 5. FIG. 1 is a perspective view illustrating a schematic configuration of a physical quantity sensor according to a first embodiment, FIG. 2 is a plan view illustrating a schematic configuration of the physical quantity sensor, and FIG. 3 is a sectional view taken along the line A-A in FIG. 1, illustrating a schematic configuration of the physical quantity sensor. FIG. 4 is a plan view illustrating a schematic configuration of a wiring provided on a substrate, and FIG. 5 is a plan view illustrating a schematic configuration a GND plane writing provided on the substrate. For convenience of description, a lid is not illustrated in FIG. 2.

Hereinafter, as illustrated in the drawings including FIGS. 6 to 8C and FIGS. 13 to 17 which will be described later, three axes which are orthogonal to each other will be respectively referred to as an X axis, a Y axis, and a Z axis. A direction parallel to the X axis will be referred to as an "X axis direction", a direction parallel to the Y axis will be referred to as a "Y axis direction", and a direction parallel to the Z axis will be referred to as a "Z axis direction". A plane including the X axis and the Y axis along a direction in which three sensor portions are disposed will also be referred to as an "XY plane".

Regarding the Z axis direction, a direction along a stacking (disposition) direction of a base substrate configuring a package and the lid, in other words, a stacking direction of a sensor element and a semiconductor circuit (IC) will be referred to as the Z axis direction. For convenience of description, in a plan view viewed from the Z axis direction, a surface on the +Z axis direction side which is the lid side will be referred to as an upper surface, and a surface on the −Z axis direction which is an opposite side thereto will be referred to as a lower surface, in some cases.

The physical quantity sensor 1 illustrated in FIGS. 1, 2, and 3 may be used as a three-axis acceleration sensor which can separately measure respective accelerations in the X axis direction, the Y axis direction, and the Z axis direction. The physical quantity sensor 1 includes a package 7, and a structural body 5 accommodated in the package 7. The structural body 5 includes an acceleration sensor element 20 as a sensor element and an integrated circuit (IC) 40 as a semiconductor circuit stacked on the acceleration sensor element 20, and a lower surface 20r of the acceleration sensor element 20 is attached to an inner bottom surface 11h of the package 7 via a resin adhesive material 18, so as to be adhered (bonded) thereto. The IC 40 is attached onto the acceleration sensor element 20, that is, to a surface of the acceleration sensor element 20 which is an opposite side to the inner bottom surface 11h of the acceleration sensor element 20 via an adhesive material 41, and is thus electrically connected to the acceleration sensor element 20 via bonding wires 43 as an electrical connection portion. More specifically, connection terminals 29 provided on the acceleration sensor element 20 are electrically connected to electrode pads 41a provided on the IC 40 via the bonding wires 43. As illustrated in FIG. 2, electrode pads 41b on the IC 40 provided on an opposite side to the electrode pads 41a with respect to a virtual central line L passing through the center of the acceleration sensor element 20 and the internal terminal 19 provided in the package 7 (an upper surface of a second base material 12) are electrically connected to each other via bonding wires 42.

Package 7

As illustrated in FIGS. 1, 2, and 3, the package 7 as a container accommodating the structural body 5 has a square outer edge in a plan view from a direction (+Z axis direction) in which the acceleration sensor element 20 overlaps the package 7, and is configured to include a base portion 10 configured with a first base material 11, the second base material 12, and a third base material 13, and a conductive lid 15 connected to the third base material 13 via a sealing member 14. The first base material 11, the second base material 12, and the third base material 13 are stacked in this order, so as to configure the base portion 10.

The first base material 11 as a substrate has a plate shape, the second base material 12 and the third base material 13 as annular substrates are annular substrates of which central parts are removed, and the sealing member 14 such as a sealing or low melting point glass is formed on a peripheral edge of an upper surface of the third base material 13. The first base material 11 corresponds to a lower plate.

A plurality of internal terminals 19 are disposed on an upper surface of the second base material 12, and a plurality of external terminals 16 are disposed on an outer bottom surface 11r of the package 7 which is a lower surface of the first base material 11. Each of the internal terminals 19 is electrically connected to a corresponding external terminal 16 via an internal wiring (not illustrated) formed in the base portion 10. A plurality of castellations 28a to 28n are formed on a side surface of the package 7.

As illustrated in FIG. 3, the first base material is a stacked substrate in which three bottom plate substrates 11a, 11b, and 11c are stacked in the present embodiment, that is, a stacking number thereof is three. A metallized GND solid pattern 35 is provided on an upper surface 11j of the bottom plate substrate 11a between the stacked bottom plate substrate 11a and bottom plate substrate 11b.

In other words, the GND solid pattern 35 is provided on the first base material 11 including the inner bottom surface 11h of the package 7, and is provided to be separated from the inner bottom surface 11h on which the structural body 5 (the acceleration sensor element 20 and the IC 40) is mounted. Since the GND solid pattern 35 is provided to be separated from the inner bottom surface 11h with the bottom plate substrates 11b and 11c interposed therebetween, a surface of the GND solid pattern 35 is not contact with the acceleration sensor element 20. Thus, an unevenness or a distortion of the surface of the GND solid pattern 35 due to residual stress caused by a difference between linear expansion coefficients of the GND solid pattern 35 and the acceleration sensor element 20 can be made to hardly propagate to the acceleration sensor element 20 disposed on the inner bottom surface 11h.

In the present embodiment, the GND solid pattern 35 is disposed between the bottom plate substrate 11a and the bottom plate substrate 11b, but is not limited thereto, and may be disposed between the bottom plate substrate 11b and the bottom plate substrate 11c. In other words, the GND solid pattern 35 is disposed between any layers of the stacked substrate, and thus at least one layer of the bottom plate substrates 11a, 11b, and 11c is interposed between the GND solid pattern 35 and the inner bottom surface 11h, so that an unevenness or a distortion of the surface of the GND solid pattern 35 is alleviated and hardly propagates to the acceleration sensor element 20.

Wirings (not illustrated) in a routing pattern may be provided between the bottom plate substrate 11b and the bottom plate substrate 11c, and between the bottom plate substrate 11c and the second base material 12. As mentioned above, since the bottom plate substrates 11a, 11b, and 11c of three layers are stacked, and the GND solid pattern 35 or the wirings (routing pattern) are provided among the bottom plate substrates 11a, 11b, and 11c, a complex wiring can be disposed without increasing a size of the package 7 in a plan view from the +Z axis direction. Since the bottom plate substrates 11a, 11b, and 11c of three layers are stacked, and thus two gaps are formed among the substrates, a more complex wiring can be disposed.

As illustrated in FIG. 4, a plurality of signal wirings 30 including serial communication wirings, a plurality of analog wirings 31 including a VDD wiring, and a GND (Ground) wiring 33 are provided on the upper surface (inner bottom surface 11h) of the bottom plate substrate 11c. The serial communication wirings are configured to include an MISO (Master In Slave Out) wiring 30a, an MOSI (Master Out Slave In) wiring 30b, and an SCLK (Serial Clock) wiring 30c. The serial communication wirings (30a, 30b, and 30c) including the MISO wiring 30a, the MOSI wiring 30b, and the SCLK wiring 30c are disposed on an opposite side to the bonding wires 43 as an electrical connection portion with respect to the virtual central line L passing through the center of the acceleration sensor element 20. In this configuration, the bonding wires 43 and the serial communication wirings (30a, 30b, and 30c) hardly electrically interfere with each other. Thus, residual noise is hardly mixed into a signal output from the acceleration sensor element 20, and thus it is possible to reduce deterioration in sensor measurement characteristics.

The GND wiring 33 is provided further toward the bonding wires 43 side than the serial communication wirings (30a, 30b, and 30c), and thus the bonding wires 43 and the serial communication wirings (30a, 30b, and 30c) electrically interfere with each other even less.

A width L1 (i.e., an average width) of the analog wiring 31 is larger than a width L2 (i.e., an average width) of the signal wiring 30. Since the width L1 of the analog wiring 31 is larger than the width L2 of the signal wiring 30, impedance of the analog wirings 31 including the VDD wiring can be reduced, and thus it is possible to reduce the influence of radiation noise from the outside of the package 7. It is possible to prevent operation noise generated in a digital circuit or the like from having the influence on an analog circuit via the bottom plate substrates 11a, 11b, and 11c.

The signal wirings 30, the analog wirings 31, and the GND wiring 33 are electrically connected to the plurality of internal terminals 19 provided on the upper surface of the second base material 12 or a plurality of wirings provided on the bottom plate substrate 11b under the bottom plate substrate 11c via electrode layers (not illustrated) formed on inner walls of a plurality of through-holes 36 provided in the bottom plate substrate 11c or conductors 32 filling the through-holes. The analog wirings 31 are electrically connected to the external terminals 16 which are respectively provided to be in contact with the castellations 28a and 28l, via electrode layers (not illustrated) formed on side surfaces of the castellations 28a and 28l. The signal wirings 30 are electrically connected to the external terminals 16 which are respectively provided to be in contact with the castellations 28e, 28f, 28g, and 28h via electrode layers (not illustrated) formed on side surfaces of the castellations 28e, 28f, 28g, and 28h. Therefore, the MISO wiring 30a, the MOSI wiring 30b, and the SCLK wiring 30c are electrically connected to the external terminals 16 via the castellations 28h, 28g, and 28e, respectively.

The width L1 of the analog wiring 31 is more preferably $L1/L2 \geq 2$ with respect to the width L2 of the signal wiring 30. A ratio of the wiring width is twice or more, and thus impedance can be further reduced, so that the influence of radiation noise from the outside of the package 7 can be further reduced.

As illustrated in FIG. 5, the GND solid pattern 35 provided on the upper surface 11j of the bottom plate substrate 11a is disposed to overlap the acceleration sensor element 20 in a plan view from the direction (+Z axis direction) in which the acceleration sensor element 20 overlaps the package 7. Thus, it is possible to block radiation noise (radiation noise such as an electromagnetic wave) from the outside of the package 7 which exerts the influence on the acceleration sensor element 20 from the first base material 11 side of the package 7, and thus to reduce the influence of the radiation noise on the acceleration sensor element 20.

The GND solid pattern 35 is electrically connected to the conductors 32 filling the through-holes provided in the bottom plate substrate 11a which will be described later, and is also electrically connected to the external terminals 16 provided to be in contact with the castellations 28b and 28m on the outer bottom surface 11r of the package 7.

Referring to FIG. 3, the package 7 is provided with a plurality of through-holes 11g penetrating through the first base material 11, through-holes 12g which penetrate through the second base material 12 and communicate with the through-holes 11g, and through-holes 13g which penetrate through the third base material 13 and communicate with the through-holes 12g, in a region in which the first base material 11, the second base material 12, and the third base material 13 overlap each other. The conductors 32 such as copper or solders fill the through-holes 11g, the through-holes 12g, and the through-holes 13g, and thus through-electrodes are formed. Thus, the lid 15 can be electrically connected to the GND solid pattern 35 via the conductors 32. Therefore, the lid 15 and the GND solid pattern 35 can block radiation noise from the outside of the package 7 which exerts the influence on the acceleration sensor element 20 from the lid 15 side of the package 7 or the first base material 11 side, and thus it is possible to further reduce the influence of radiation noise.

In the package 7, a recessed portion 17a (a recess) which accommodates the structural body 5 is formed by the inner bottom surface 11h of the first base material mounted with the structural body 5, and the annular substrate in which the annular second base material 12 and third base material 13 of which the central parts are removed are stacked. In the package 7, an opening 17b of the recessed portion 17a is closed by the lid 15, that is, sealed such that an accommodation space (internal space) which is a closed space (enclosed space) 17 is provided, and thus the structural body 5 may be accommodated in the accommodation space 17. As mentioned above, since the structural body 5 configured with the acceleration sensor element 20 and the IC 40 is accommodated in the accommodation space 17 provided between the base portion 10 and the lid 15, the structural body 5 can be blocked from the external atmosphere of the package 7, and thus it is possible to obtain the physical quantity sensor 1 which is compact and has high performance. Some wirings or electrode pads (terminal electrodes) formed in the base portion 10 including the first base material 11 or the second base material 12 are not illustrated.

Ceramics or the like are suitably used as constituent materials of the first base material 11, the second base material 12, and the third base material 13. Not only ceramics but also glass, resin, metal, or the like may be used as constituent materials of the first base material 11, the second base material 12, and the third base material 13. A constituent material of the lid 15 may be conductive, and, for example, a metal material such as Kovar, or a glass material, a silicon material, or a ceramic material metallized with metal may be used.

The signal wirings 30, the analog wirings 31, the GND wiring 33, the GND solid pattern 35, the internal terminals 19, and the external terminals 16 may be formed according to, for example, a method in which a metal wiring material such as tungsten (W) or molybdenum (Mo) is screen-printed at a predetermined position and is baked at a high temperature, and nickel (Ni) or gold (Au) is plated thereon.

Structural Body 5

The structural body 5 includes the acceleration sensor element 20, and the IC 40 as a semiconductor circuit which is electrically connected to the acceleration sensor element 20 and is adhered to the acceleration sensor element 20 via the adhesive material 41. In other words, the IC 40 is attached to a surface (i.e., a top, upper, or distal surface) of the acceleration sensor element 20 on an opposite side to the lower surface 20r (i.e., a bottom, lower or proximal surface) which is a surface on the first base material 11 side configuring the package 7. As mentioned above, the package 7, the acceleration sensor element 20, and the IC 40 are stacked, and thus it is possible to reduce an area of the physical quantity sensor 1 in a plan view by increasing disposition efficiency in a planar direction.

As illustrated in FIG. 3, the lower surface 20r of the acceleration sensor element 20 is bonded to the inner bottom surface 11h which is an upper surface of the first base material 11 configuring the base portion 10 as a bottom plate via the resin adhesive material 18, and the structural body 5 is accommodated in the accommodation space 17 of the package 7. The accommodation space 17 of the package 7 is air-tightly sealed in a reduced-pressure atmosphere lower than the atmospheric pressure, or in an inert gas atmosphere such as nitrogen or helium.

Acceleration Sensor Element 20 as Sensor Element

Figure 6:
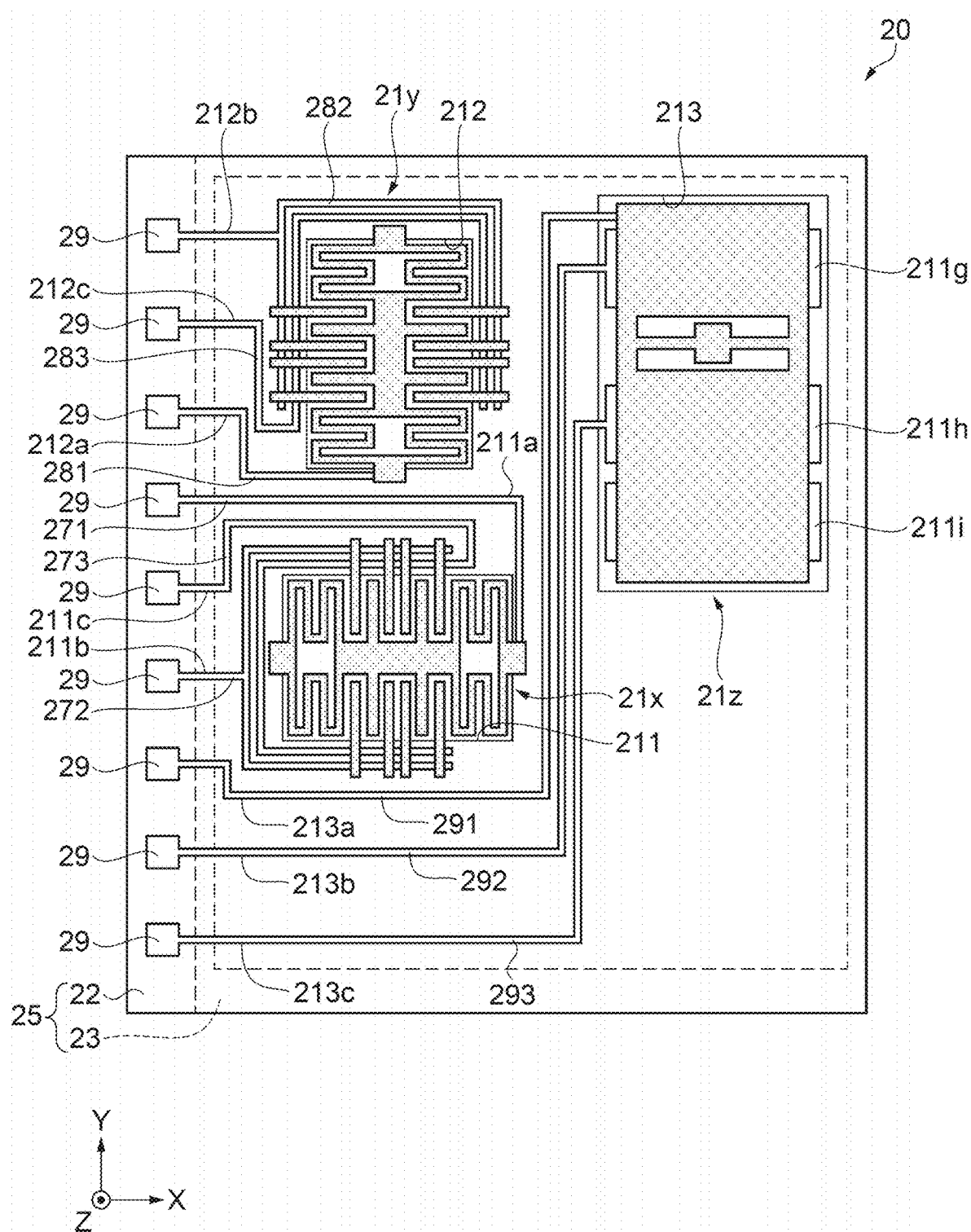
FIG. 6 is a plan view illustrating a disposition example of a sensor element used in the physical quantity sensor.

Next, with reference to FIGS. 6 and 7, a description will be made of a sensor element used in the physical quantity sensor. FIG. 6 is a plan view illustrating a disposition example of a sensor element used in the physical quantity sensor, and FIG. 7 is a sectional view illustrating a schematic configuration of the sensor element.

Figure 7:
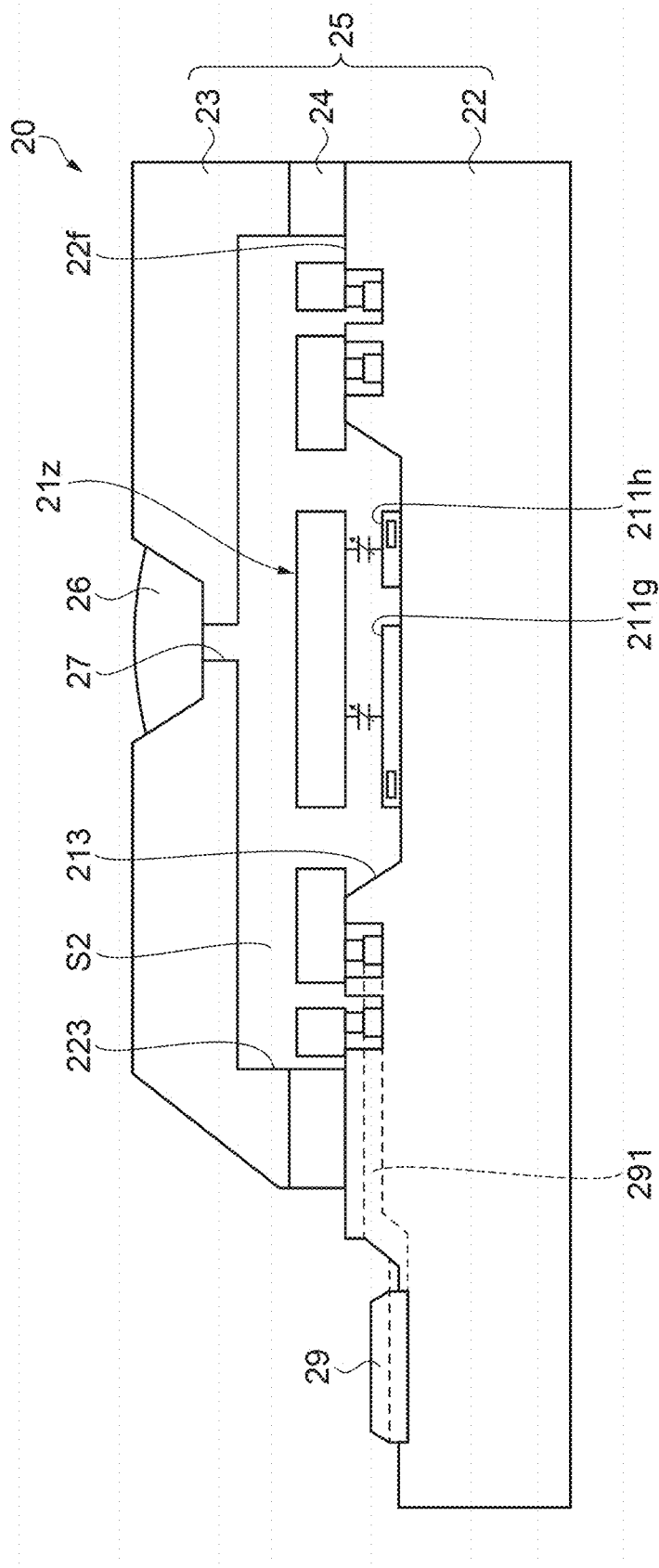
FIG. 7 is a sectional view illustrating a schematic configuration of the sensor element.

As illustrated in FIGS. 6 and 7, the acceleration sensor element 20 as a sensor element includes a container 25 having a base substrate 22 and a cap portion 23, and an X-axis sensor portion 21x, a Y-axis sensor portion 21y, and a Z-axis sensor portion 21z which are three sensor portions accommodated in the container 25. For convenience of description, FIG. 7 illustrates only the Z-axis sensor portion 21z.

The base substrate 22 is provided with depressed portions 211, 212, and 213 which are open upward. Above all, the depressed portion 211 functions as a relief portion for preventing the X-axis sensor portion 21x disposed thereon from being brought into contact with the base substrate 22. Similarly, the depressed portion 212 functions as a relief portion for preventing the Y-axis sensor portion 21y disposed thereon from being brought into contact with the base substrate 22. The depressed portion 213 functions as a relief portion for preventing the Z-axis sensor portion 21z disposed thereon from being brought into contact with the base substrate 22.

The base substrate 22 is provided with depresses portions 211a, 211b, and 211c, depressed portions 212a, 212b, and 212c, and depressed portions 213a, 213b, and 213c, which are open to the upper surface. Above all, the depressed portions 211a, 211b, and 211c are disposed around the depressed portion 211, and wirings 271, 272, and 273 for the X-axis sensor portion 21x are disposed in the depresses portions 211a, 211b, and 211c. The depressed portions 212a, 212b, and 212c are disposed around the depressed portion 212, and wirings 281, 282, and 283 for the Y-axis sensor portion 21y are disposed in the depressed portions 212a, 212b, and 212c. The depressed portions 213a, 213b, and 213c are disposed around the depressed portion 213, and wirings 291, 292, and 293 for the Z-axis sensor portion 21z are disposed in the depressed portions 213a, 213b, and 213c. An end of each of the wirings 271, 272, 273, 281, 282, 283, 291, 292, and 293 is exposed to the outside of the container 25, and the exposed portion becomes the connection terminal 29. Each connection terminal 29 is electrically connected to the electrode pad 41a (refer to FIG. 2) provided on the IC 40 via the bonding wire 43.

The base substrate 22 is made of a glass material (for example, borosilicate glass such as Pyrex glass (registered trademark)) containing alkali metal ions (movable ions). Consequently, the X-axis sensor portion 21x, the Y-axis sensor portion 21y, and the Z-axis sensor portion 21z configured with silicon substrates can be firmly bonded to the base substrate 22 through anodic bonding. The base substrate 22 can be made light-transmissive, and thus the inside of the container 25 can be observed through the base substrate 22. However, a constituent material of the base substrate 22 is not limited to a glass material, and, for example, a silicon material having high resistance may be used. In this case, bonding to the X-axis sensor portion 21x, the Y-axis sensor portion 21y, and the Z-axis sensor portion 21z may be performed via, for example, a resin-based adhesive material, a glass paste, or a metal layer.

Figure 8A:
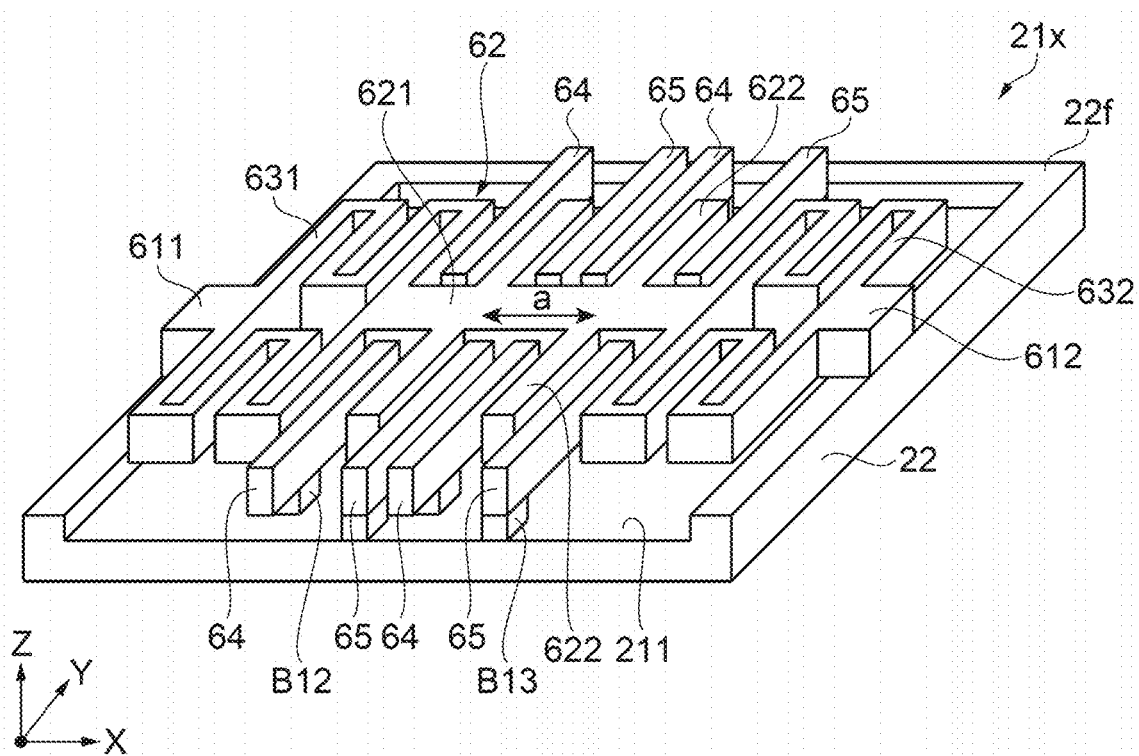
FIG. 8A is a perspective view illustrating a schematic configuration of a sensor portion (X axis direction measurement) of the sensor element.
Figure 8B:
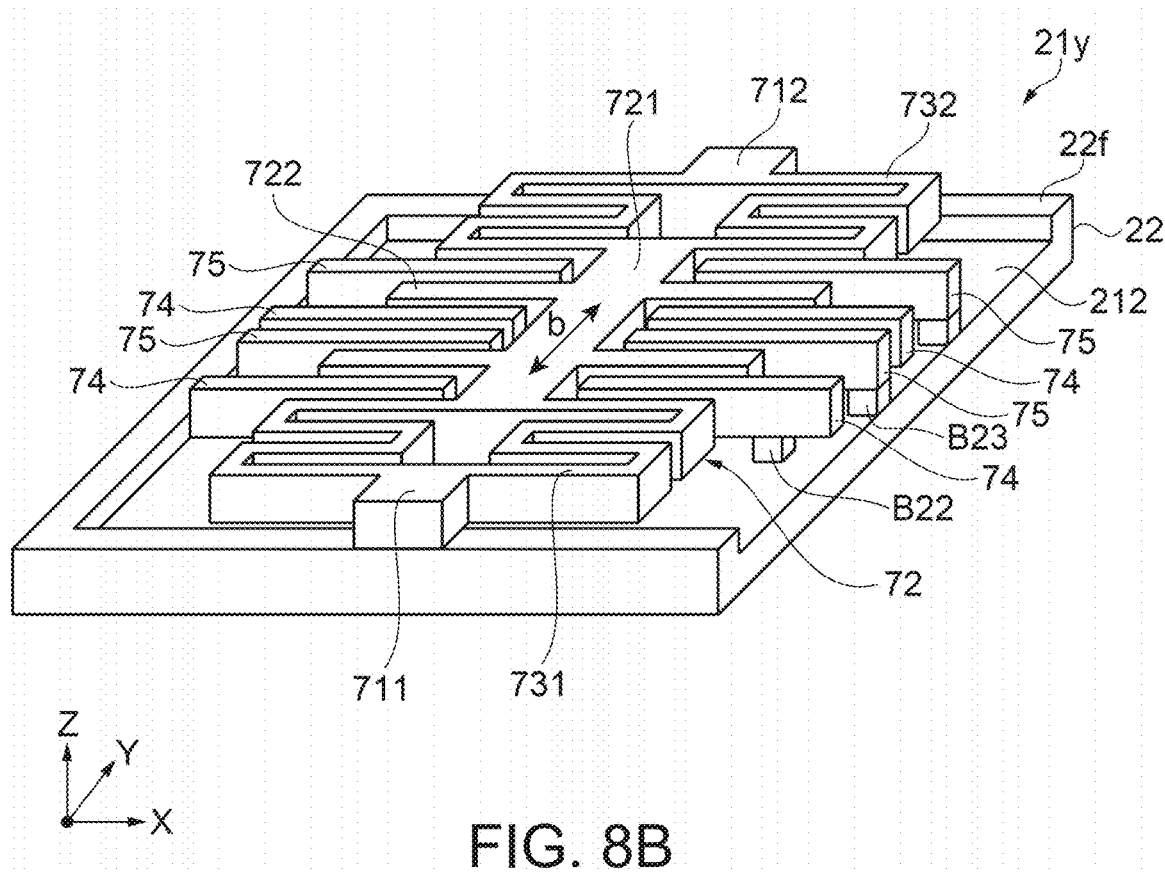
FIG. 8B is a perspective view illustrating a schematic configuration of a sensor portion (Y axis direction measurement) of the sensor element.
Figure 8C:
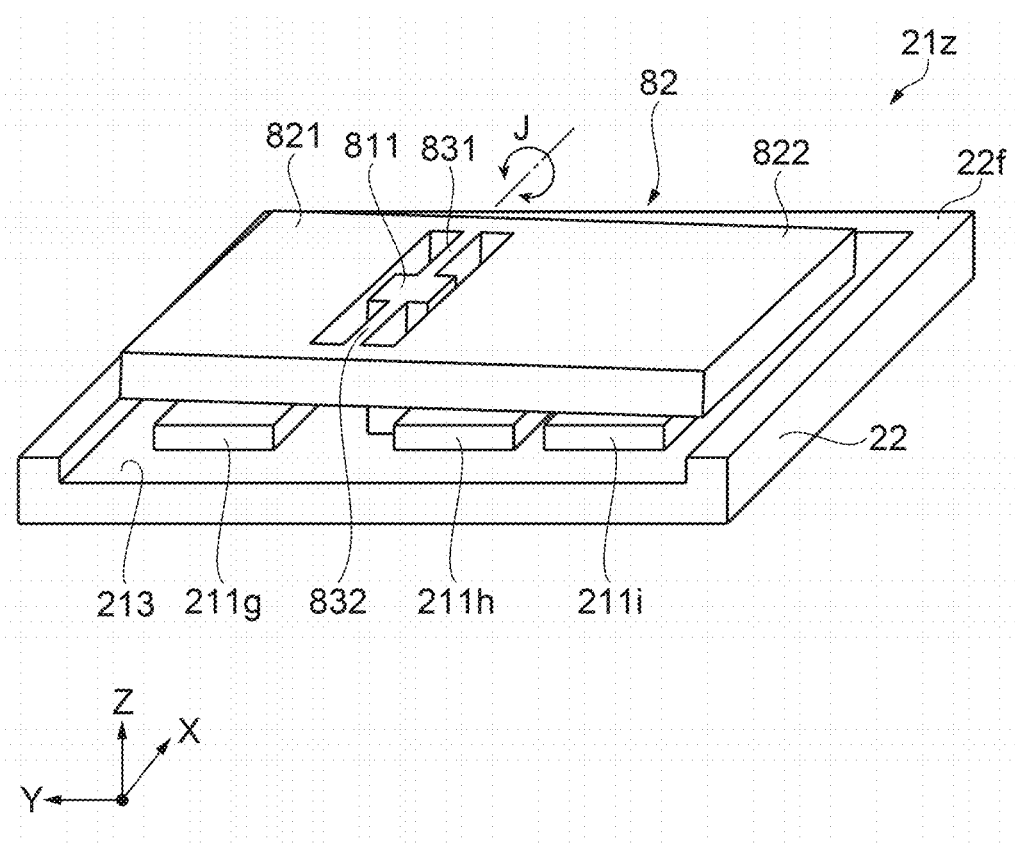
FIG. 8C is a perspective view illustrating a schematic configuration of a sensor portion (Z axis direction measurement) of the sensor element.

Next, with reference to FIGS. 8A, 8B, and 8C, the sensor portions of the sensor element will be described in detail. FIG. 8A is a perspective view illustrating a schematic configuration of a sensor portion (X axis direction measurement), FIG. 8B is a perspective view illustrating a schematic configuration of a sensor portion (Y axis direction measurement), and FIG. 8C is a perspective view illustrating a schematic configuration of a sensor portion (Z axis direction measurement).

The X-axis sensor portion 21x which is one of the sensor portions measures an acceleration in the X axis direction. As illustrated in FIG. 8A, the X-axis sensor portion 21x includes support parts 611 and 612, a movable part 62, connection parts 631 and 632, a plurality of first fixed electrode fingers 64, and a plurality of second fixed electrode fingers 65. The movable part 62 includes a base 621 and a plurality of movable electrode fingers 622 extending toward both sides in the Y axis direction from the base 621. The X-axis sensor portion 21x is configured with a silicon substrate doped with an impurity such as phosphor or boron, and the silicon substrate is conductive.

The support parts 611 and 612 are bonded to an upper surface 22f of the base substrate 22 through anode bonding, and the support part 611 is electrically connected to the wiring 271 via a conductive bump (not illustrated). The movable part 62 is provided between the support parts 611 and 612. The movable part 62 is connected to the support parts 611 and 612 via the connection parts 631 and 632. The connection parts 631 and 632 can be elastically deformed in the X axis direction like a spring, and thus the movable part 62 can be displaced in the X axis direction as indicated by an arrow a with respect to the support parts 611 and 612.

The plurality of first fixed electrode fingers 64 are disposed on one side of the movable electrode fingers 622 in the X axis direction, and are arranged in a comb shape to mesh with the corresponding movable electrode fingers 622 with gaps. The plurality of first fixed electrode fingers 64 are bonded to the upper surface of the depressed portion 211 of the base substrate 22 at basal ends thereof through anode bonding, and are electrically connected to the wiring 272 via conductive bumps B12.

In contrast, the plurality of second fixed electrode fingers 65 are disposed on the other side of the movable electrode fingers 622 in the X axis direction, and are arranged in a comb shape to mesh with the corresponding movable electrode fingers 622 with gaps. The plurality of second fixed electrode fingers 65 are bonded to the upper surface of the depressed portion 211 of the base substrate at basal ends thereof through anode bonding, and are electrically connected to the wiring 273 via conductive bumps B13.

An acceleration in the X axis direction is measured as follows by using the X-axis sensor portion 21x. In other words, in a case where an acceleration in the X axis direction is applied, the movable part 62 is displaced in the X axis direction while elastically deforming the connection parts 631 and 632 on the basis of the magnitude of the acceleration. The magnitude of electrostatic capacitance between the movable electrode finger 622 and the first fixed electrode finger 64, and the magnitude of electrostatic capacitance between the movable electrode finger 622 and the second fixed electrode finger 65 are changed due to the displacement. The IC 40 obtains the acceleration on the basis of the change of the electrostatic capacitance.

The Y-axis sensor portion 21y which is one of the sensor portions measures an acceleration in the Y axis direction. The Y-axis sensor portion 21y has the same configuration as that of the X-axis sensor portion 21x except that the Y-axis sensor portion 21y is disposed in a state of being rotated by 90°. As illustrated in FIG. 8B, the Y-axis sensor portion 21y includes support parts 711 and 712, a movable part 72, connection parts 731 and 732, a plurality of first fixed electrode fingers 74, and a plurality of second fixed electrode fingers 75. The movable part 72 includes a base 721 and a plurality of movable electrode fingers 722 extending toward both sides in the X axis direction from the base 721.

The support parts 711 and 712 are bonded to the upper surface 22f of the base substrate 22 through anode bonding, and the support part 711 is electrically connected to the wiring 281 via a conductive bump (not illustrated). The movable part 72 is provided between the support parts 711 and 712. The movable part 72 is connected to the support parts 711 and 712 via the connection parts 731 and 732. The connection parts 731 and 732 can be elastically deformed in the Y axis direction like a spring, and thus the movable part 72 can be displaced in the Y axis direction as indicated by an arrow b with respect to the support parts 711 and 712.

The plurality of first fixed electrode fingers 74 are disposed on one side of the movable electrode fingers 722 in the Y axis direction, and are arranged in a comb shape to mesh with the corresponding movable electrode fingers 722 with gaps. The plurality of first fixed electrode fingers 74 are bonded to the upper surface of the depressed portion 212 of the base substrate 22 at basal ends thereof through anode bonding, and are electrically connected to the wiring 282 via conductive bumps B22.

In contrast, the plurality of second fixed electrode fingers 75 are disposed on the other side of the movable electrode fingers 722 in the Y axis direction, and are arranged in a comb shape to mesh with the corresponding movable electrode fingers 722 with gaps. The plurality of second fixed electrode fingers 75 are bonded to the upper surface of the depressed portion 212 of the base substrate at basal ends thereof through anode bonding, and are electrically connected to the wiring 283 via conductive bumps B23.

An acceleration in the Y axis direction is measured as follows by using the Y-axis sensor portion 21y. In other words, in a case where an acceleration in the Y axis direction is applied, the movable part 72 is displaced in the Y axis direction while elastically deforming the connection parts 731 and 732 on the basis of the magnitude of the acceleration. The magnitude of electrostatic capacitance between the movable electrode finger 722 and the first fixed electrode finger 74, and the magnitude of electrostatic capacitance between the movable electrode finger 722 and the second fixed electrode finger 75 are changed due to the displacement. The IC 40 obtains the acceleration on the basis of the change of the electrostatic capacitance.

The Z-axis sensor portion 21z which is one of the sensor portions measures an acceleration in the Z axis direction. As illustrated in FIG. 8C, the Z-axis sensor portion 21z includes a support part 811, a movable part 82, and a pair of connection parts 831 and 832 connecting the movable part 82 to the support part 811 in a swingable manner. The movable part 82 is swung like a seesaw with respect to the support part 811 with the connection parts 831 and 832 as an axis J. The Z-axis sensor portion 21z is configured with a silicon substrate doped with an impurity such as phosphor or boron, and the silicon substrate is conductive.

The support part 811 is bonded to the upper surface 22f of the base substrate 22 through anode bonding, and the support part 811 is electrically connected to the wiring 291 via a conductive bump (not illustrated). The movable part 82 is provided on both sides of the support part 811 in the Y axis direction. The movable part 82 has a first movable section 821 which is located further toward the +Y direction side than the axis J, and a second movable section 822 which is located further toward the −Y direction side than the axis J and is larger than the first movable section 821. The first movable section 821 and the second movable section 822 have different rotational momenta when accelerations in the vertical direction (Z axis direction) are respectively applied thereto, and the movable part 82 is designed such that a predetermined tilt occurs therein depending on accelerations. Consequently, in a case where an acceleration in the Z axis direction is applied, the movable part 82 is swung around the axis J like a seesaw.

A first detection electrode 211g electrically connected to the wiring 292 is disposed at a position facing the first movable section 821 on the bottom surface of the depressed portion 213, and a second detection electrode 211h electrically connected to the wiring 293 is disposed at a position facing the second movable section 822. Thus, an electrostatic capacitor is formed between the first movable section 821 and the first detection electrode 211g, and an electrostatic capacitor is formed between the second movable section 822 and the second detection electrode 211h. A dummy electrode 211i may be provided further toward the −Y axis side than the second detection electrode 211h at the position facing the second movable section 822. The first detection electrode 211g, the second detection electrode 211h, and the dummy electrode 211i are preferably made of a transparent conductive material such as ITO.

An acceleration in the Z axis direction is measured as follows by using the Z-axis sensor portion 21z. In other words, in a case where an acceleration in the Z axis direction is applied, the movable part 82 is swung around the axis J like a seesaw. Since the movable part 82 is swung like a seesaw, a separation distance between the first movable section 821 and the first detection electrode 211g and a separation distance between the second movable section 822 and the second detection electrode 211h are changed, and thus electrostatic capacitances therebetween are changed. The IC 40 obtains the acceleration on the basis of the changes of the electrostatic capacitances.

As illustrated in FIG. 7, the cap portion 23 has a depressed part 223 which is open downward, and is bonded to the base substrate 22 such that the depressed part 223 forms an internal space along with the depressed portions 211, 212, and 213. The cap portion 23 is configured with a silicon substrate in the present embodiment.

The cap portion 23 and the base substrate 22 are airtightly bonded to each other by using glass frits 24. A stepped sealing hole 27 which penetrates from the depressed part 223 to the outside is provided in the cap portion 23. The sealing hole 27 is sealed by using a melted metal 26, for example, a melted gold-germanium alloy (AuGe) in a state in which an internal space S2 is in a nitrogen ($N_2$) atmosphere.

IC 40 as Semiconductor Circuit

As illustrated in FIG. 3, the IC 40 is disposed on the upper surface of the acceleration sensor element 20 via the adhesive material 41. The adhesive material 41 is not particularly limited as long as the IC 40 can be fixed to the acceleration sensor element 20, and, for example, a solder, a silver paste, or a resin-based adhesive material (die attach material) may be used.

The IC 40 is provided with a plurality of electrode pads 41*a* and 41*b* on the upper surface thereof, and the respective electrode pads 41*a* on the connection terminal 29 side of the acceleration sensor element 20 with respect to the virtual central line L passing through the center of the acceleration sensor element 20 are electrically connected to the connection terminals 29 of the acceleration sensor element 20 via the bonding wires 43. The respective electrode pads 41*b* on the opposite side (the internal terminal 19 side of the second base material 12) to the connection terminal 29 with respect to the virtual central line L of the acceleration sensor element 20 are electrically connected to the internal terminals 19 of the second base material 12 via the bonding wires 42. Consequently, a signal detected by the acceleration sensor element 20 can be output as an acceleration signal through control in the IC 40.

Next, with reference to FIG. 9, a description will be made of a configuration of a physical quantity measurement circuit 4 of the IC 40.

Figure 9:
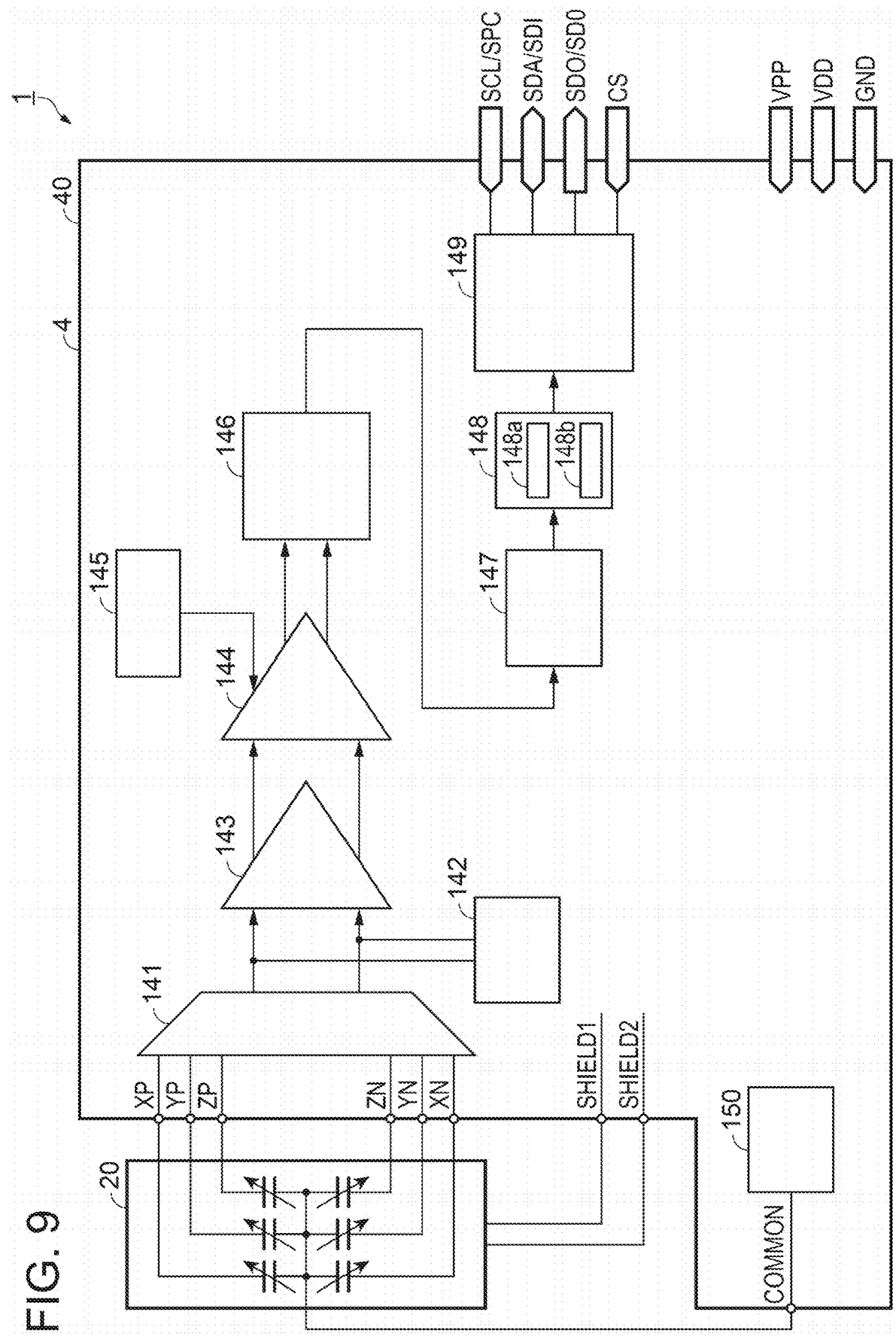
FIG. 9 is a diagram illustrating a configuration of a physical quantity measurement circuit.

As illustrated in FIG. 9, the physical quantity measurement circuit 4 is configured to include a multiplexer 141, an offset adjustment capacitor 142, a Q/V amplifier (QVA) 143, a programmable gain amplifier (PGA) 144, a temperature sensor 145, an A/D conversion circuit (ADC) 146, a digital filter 147, a storage unit 148, an interface circuit 149, and a drive circuit 150.

The drive circuit 150 applies a drive signal to the acceleration sensor element 20 via a terminal COMMON on the basis of a clock signal and a frequency (drive frequency) clock signal. The acceleration sensor element 20 is provided with shield ground wirings (not illustrated), and a power source voltage (for example, 0 V) is supplied to the ground wirings via terminals SHIELD1 and SHIELD2 of the physical quantity measurement circuit 4.

Thereafter, detection signals which are detected by the acceleration sensor element 20 are input to the multiplexer 141 via terminals XP, YP, ZP, XN, YN, and ZN.

The multiplexer 141 outputs two differential signal pairs on the basis of clock signals which become active (a high level in the present embodiment) exclusively to each other. Each of the two output differential signal pairs is subjected to zero adjustment in the offset adjustment capacitor 142, and is then input to the Q/V amplifier 143.

The Q/V amplifier 143 converts the differential signal pairs of electric charge output from the multiplexer 141 into differential signal pairs of a voltage.

The programmable gain amplifier 144 receives the differential signal pairs (differential voltage signals) output from the Q/V amplifier 143, and outputs differential signal pairs which are amplified from the differential signal pairs. In this case, the differential signal pairs are subjected to temperature correction on the basis of temperature information in the temperature sensor 145.

The A/D conversion circuit 146 converts analog signals which are voltage signals of the differential signal pairs into digital signals.

The digital filter 147 performs a filtering process on the digital signals output from the A/D conversion circuit 146 on the basis of the clock signal. Since high frequency noise generated due to the A/D conversion process in the A/D conversion circuit 146 is superimposed on the digital signals output from the A/D conversion circuit 146, the digital filter 147 functions as a low-pass filter reducing the high frequency noise. The digital signals output from the digital filter 147 include an X-axis acceleration signal (an example of a "physical quantity signal") having a digital value corresponding to the magnitude and a direction of an X-axis acceleration, a Y-axis acceleration signal (an example of a "physical quantity signal") having a digital value corresponding to the magnitude and a direction of a Y-axis acceleration, and a Z-axis acceleration signal (an example of a "physical quantity signal") having a digital value corresponding to the magnitude and a direction of a Z-axis acceleration, in a time division manner.

Therefore, a circuit including the Q/V amplifier 143, the programmable gain amplifier 144, the A/D conversion circuit 146, and the digital filter 147 functions as a three-axis acceleration signal generation circuit (an example of a "physical quantity signal generation circuit") which generates three-axis acceleration signals (an X-axis acceleration signal, a Y-axis acceleration signal, and a Z-axis acceleration signal) measured for the X axis, the Y axis, and the Z axis, on the basis of three-axis differential signal pairs output from the acceleration sensor element 20 which measures accelerations about the X axis, the Y axis, and the Z axis which are three different axes.

The storage unit 148 includes a register 148*a* and a nonvolatile memory 148*b*.

The nonvolatile memory 148*b* stores various pieces of information such as various pieces of data (for example, gain adjustment data of the programmable gain amplifier 144 and a filter coefficient of the digital filter 147) regarding each circuit included in the physical quantity measurement circuit 4. The nonvolatile memory 148*b* may be configured with, for example, a metal oxide nitride oxide silicon (MONOS) type memory, or an electrically erasable programmable read only memory (EEPROM). When power is supplied to the physical quantity measurement circuit 4 (a power source voltage rises from 0 V to VDD), the various pieces of data stored in the nonvolatile memory 148*b* is transmitted to and held in the register 148*a*, and the various pieces of data held in the register 148*a* is supplied to each circuit.

The three-axis acceleration signals output from the digital filter 147 are respectively stored as n-bit acceleration data of three axes in the register 148*a*. Flag information including an abnormality detection flag, an X axis abnormality detection flag, a Y axis abnormality detection flag, a Z axis abnormality detection flag, and an abnormality diagnosis execution flag is stored in the register 148a.

The interface circuit 149 outputs the three-axis acceleration signals (the X-axis acceleration signal, the Y-axis acceleration signal, and the Z-axis acceleration signal) corresponding to the magnitudes of accelerations measured about the X axis, the Y axis, and the Z axis as digital signals via the serial communication wirings (30a, 30b, and 30c), and performs communication with external devices (not illustrated) of the physical quantity sensor 1 via the serial communication wirings (30a, 30b, and 30c). The external devices may write or read data into or from the storage unit 148 via the interface circuit 149. The interface circuit 149 may be, for example, a serial peripheral interface (SPI) circuit with three terminals or four terminals, and may be an inter integrated circuit (I2C) interface circuit with two terminals. For example, the external devices may read the three-axis acceleration data and the flag information stored in the storage unit 148 (register 148a), and may perform various processes by using the three-axis acceleration data.

Figure 10:
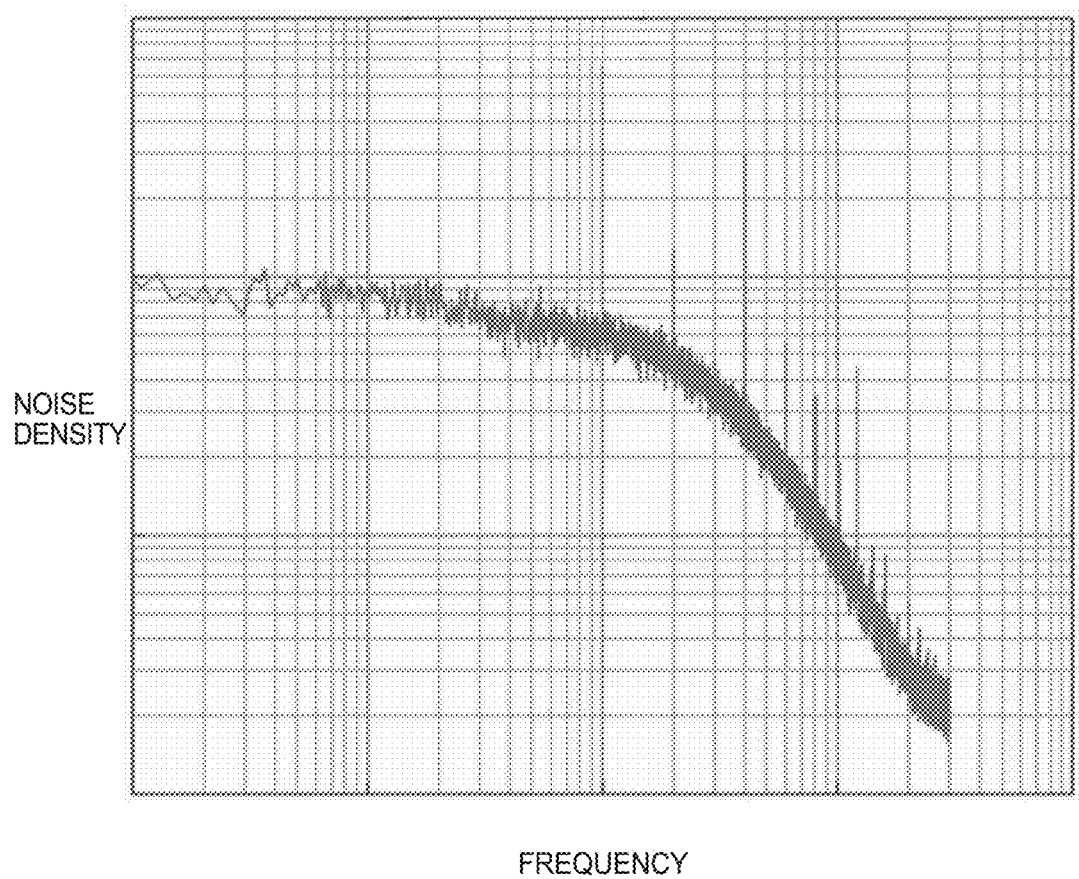
FIG. 10 is a graph illustrating a noise characteristic measurement result in the physical quantity sensor according to the first embodiment.
Figure 11:
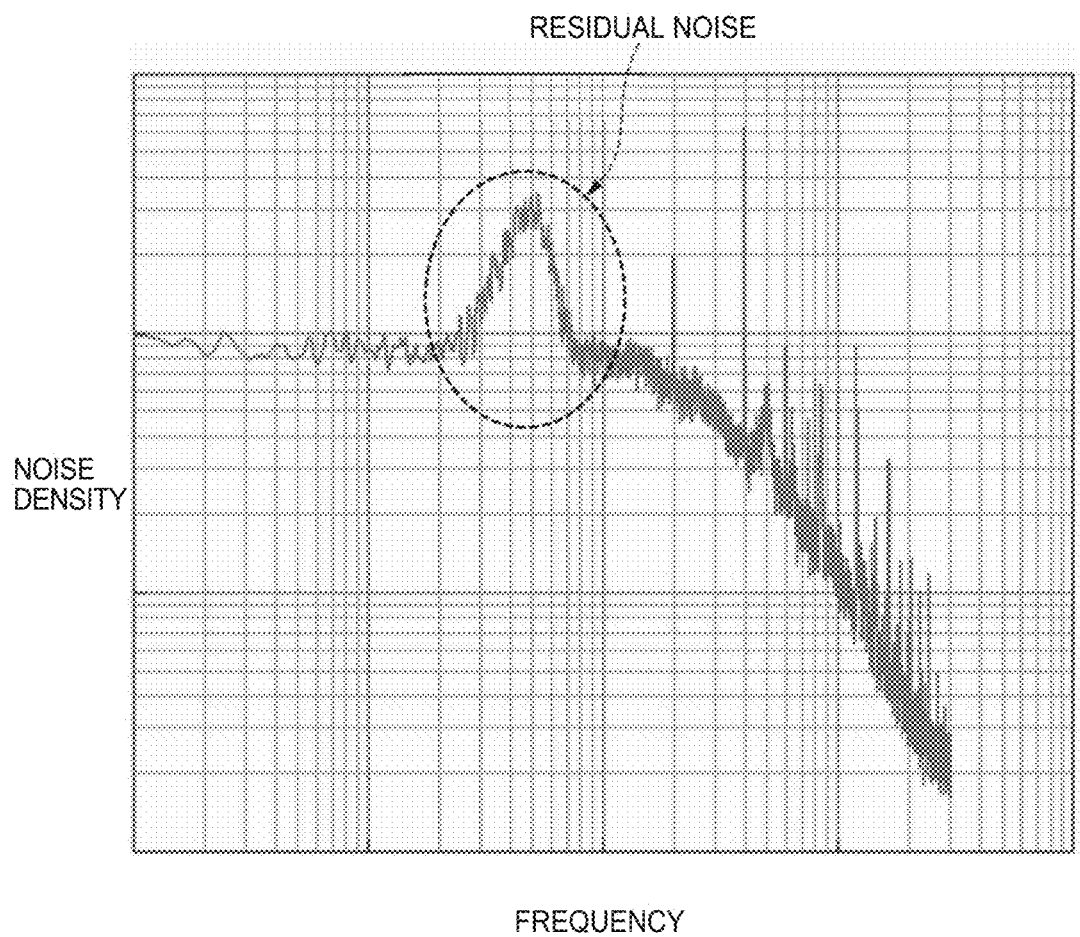
FIG. 11 is a graph illustrating a noise characteristic measurement result in a physical quantity sensor having a structure of the related art.

Next, with reference to FIGS. 10 and 11, noise characteristics of the physical quantity sensor 1 according to the first embodiment will be described. FIG. 10 is a graph illustrating a noise characteristic measurement result in the physical quantity sensor according to the first embodiment, and FIG. 11 is graph illustrating a noise characteristic measurement result in a physical quantity sensor having a structure of the related art. In FIGS. 10 and 11 illustrating noise characteristics, a longitudinal axis expresses a noise density, and a transverse axis expresses a frequency.

Noise Characteristics

FIG. 10 illustrates a noise characteristic measurement result of a Z-axis acceleration signal as an example of noise characteristics of the physical quantity sensor 1 according to the present embodiment. As a result, the noise characteristics show that a noise density is reduced as a frequency increases.

In contrast, in a noise characteristic measurement result of the Z-axis acceleration signal in the physical quantity sensor having the structure of the related art, as illustrated in FIG. 11, the noise characteristics show that a noise density is reduced as a frequency increases, but residual noise occurs at a predetermined frequency band. Here, the structure of the related art is a package structure in which, in FIG. 4, the serial communication wirings (30a, 30b, and 30c) including the MISO wiring 30a, the MOSI wiring 30b, and the SCLK wiring 30c are disposed near the castellations 28j, 28k, and 28l, and are adjacent to the bonding wires 43 electrically connecting the acceleration sensor element 20 and the IC 40 to each other. Therefore, it may become easier for the serial communication wirings (30a, 30b, and 30c) and the bonding wires 43 to electrically interfere with each other, and thus residual noise may be mixed into a detection signal from the acceleration sensor element 20 due to the influence of noise from the serial communication wirings (30a, 30b, and 30c). Therefore, in the present embodiment, the serial communication wirings (30a, 30b, and 30c) including the MISO wiring 30a, the MOSI wiring 30b, and the SCLK wiring 30c are disposed on an opposite side to the bonding wires 43 with respect to the virtual central line L of the acceleration sensor element 20, and thus mixture of residual noise from the serial communication wirings (30a, 30b, and 30c) is reduced.

FIG. 10 illustrates a noise characteristic measurement result of a Z-axis acceleration signal, but, as a result of performing the same measurement for an X-axis acceleration signal or a Y-axis acceleration signal, there is no occurrence of residual noise. However, in the physical quantity sensor having the structure of the related art, the occurrence of residual noise of which the magnitude differs in noise density has also been found with respect to an X-axis acceleration signal or a Y-axis acceleration signal.

According to the physical quantity sensor 1 according to the first embodiment, since the serial communication wirings (30a, 30b, and 30c) including the MISO wiring 30a, the MOSI wiring 30b, and the SCLK wiring 30c are disposed on an opposite side to the bonding wires 43 as an electrical connection portion with respect to the virtual central line L of the acceleration sensor element 20, the serial communication wirings (30a, 30b, and 30c) and the bonding wires 43 hardly electrically interfere with each other, and thus it is possible to reduce residual noise from the serial communication wirings (30a, 30b, and 30c) mixing into a signal output from the acceleration sensor element 20. Therefore, it is possible to reduce deterioration in sensor measurement characteristics of the physical quantity sensor 1.

Since the GND wiring 33 is provided on the side on which the bonding wires 43 as an electrical connection portion are disposed, the GND wiring 33 is disposed between the bonding wires 43 and the serial communication wirings (30a, 30b, and 30c), and thus the bonding wires 43 and the serial communication wirings (30a, 30b, and 30c) electrically interfere with each other even less. Therefore, it is possible to further reduce deterioration in sensor measurement characteristics of the physical quantity sensor 1.

Second Embodiment

Physical Quantity Sensor 1a

Figure 12:
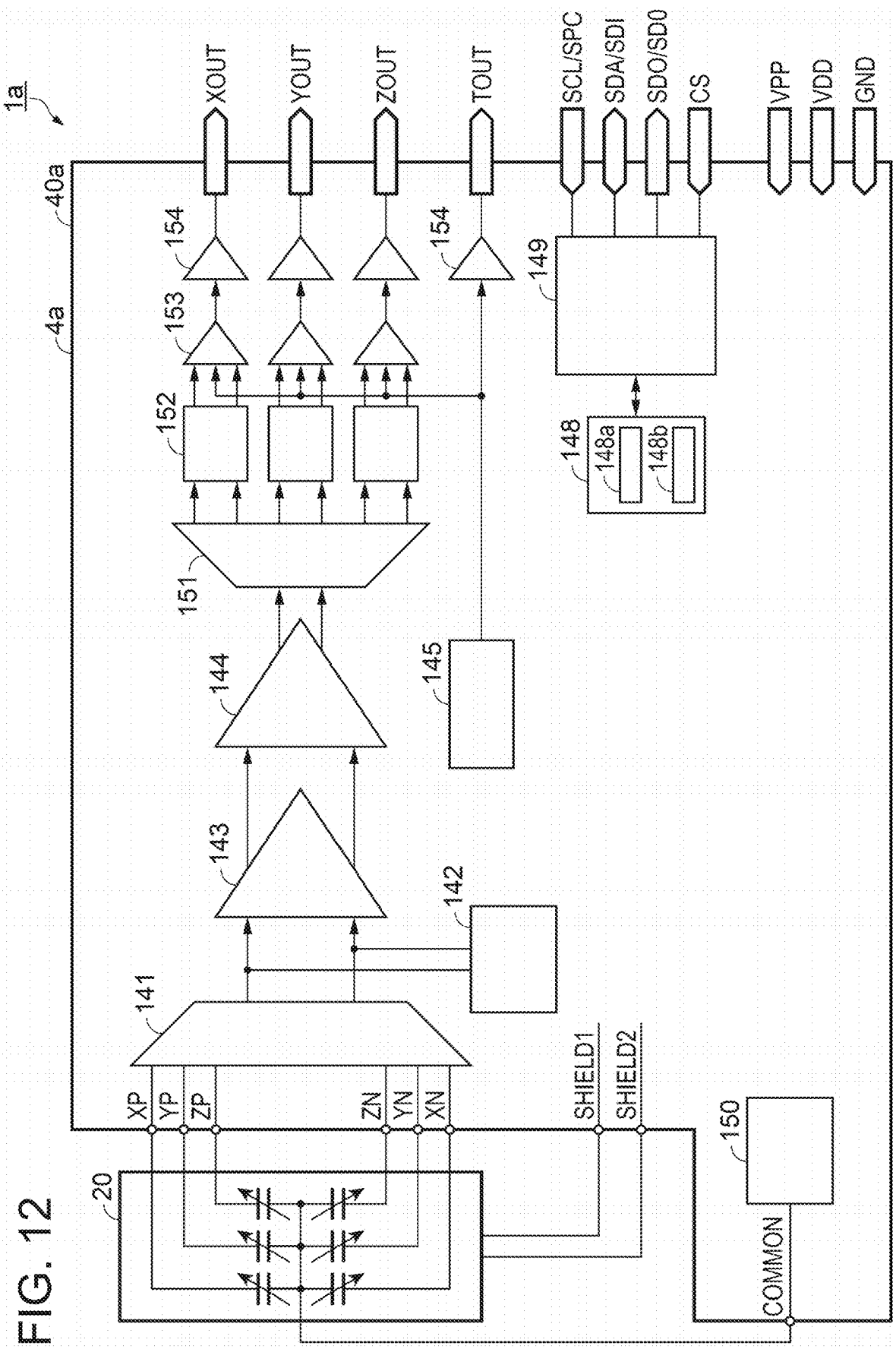
FIG. 12 is a diagram illustrating a configuration of a physical quantity measurement circuit of a physical quantity sensor according to a second embodiment.

Next, with reference to FIG. 12, a description will be made of a physical quantity sensor 1a according to a second embodiment. FIG. 12 is a diagram illustrating a configuration of a physical quantity measurement circuit of the physical quantity sensor according to the second embodiment. In the following description, differences from the first embodiment will be focused, and description of the same content will be omitted.

The physical quantity sensor 1a according to the second embodiment is different from the physical quantity sensor 1 according to the first embodiment in terms of a configuration of a physical quantity measurement circuit 4a of an IC 40a. Whereas the physical quantity measurement circuit 4 of the physical quantity sensor 1 according to the first embodiment is a digital output circuit, the physical quantity measurement circuit 4a of the physical quantity sensor 1a according to the second embodiment is an analog output circuit.

As illustrated in FIG. 12, the physical quantity sensor 1a of the second embodiment amplifies differential signal pairs of a voltage output from the Q/V amplifier 143 with the programmable gain amplifier 144 in the physical quantity measurement circuit 4a of the IC 40a in the same manner as the physical quantity measurement circuit 4 of the first embodiment. Thereafter, the amplified differential signal pairs are input to a demultiplexer 151.

The demultiplexer 151 divides the amplified differential signal pairs into differential signal pairs of three axes, that is, a differential signal pair of the X axis, a differential signal pair of the Y axis, and a differential signal pair of the Z axis again, and inputs the differential signal pairs to a low-pass filter 152.

The low-pass filter 152 removes high frequency noise superimposed in the demultiplexer 151 in the previous stage, and inputs each of the differential signal pairs of the three axes to a multiplier 153.

The multipliers 153 multiply the respective differential signal pairs of the three axes by a temperature correction value based on temperature information in the temperature sensor 145, so as to generate three-axis acceleration signals (an X-axis acceleration signal, a Y-axis acceleration signal, and a Z-axis acceleration signal) corresponding to the magnitudes of accelerations measured about the X axis, the Y axis, and the Z axis. Thereafter, the three-axis acceleration signals (the X-axis acceleration signal, the Y-axis acceleration signal, and the Z-axis acceleration signal) are respectively output as analog signals from three output terminals XOUT, YOUT, and ZOUT via a buffer 154. The temperature information in the temperature sensor 145 is also output as an analog signal from an output terminal TOUT via the buffer 154.

The interface circuit 149 performs communication with external devices (not illustrated) of the physical quantity sensor 1a via the serial communication wirings (30a, 30b, and 30c) in the same manner as in the physical quantity measurement circuit 4 of the first embodiment. The external devices may write or read data into or from the storage unit 148 via the interface circuit 149.

According to the physical quantity sensor 1a according to the second embodiment, in the same manner as in the first embodiment, even if the physical quantity sensor 1a is an analog output circuit, it is possible to reduce residual noise mixing into a signal output from the acceleration sensor element 20 due to electrical interference between the bonding wires 43 and the serial communication wirings (30a, 30b, and 30c), and thus to reduce deterioration in sensor measurement characteristics of the physical quantity sensor 1a.

Third Embodiment

Physical Quantity Sensor 1b

Figure 13:
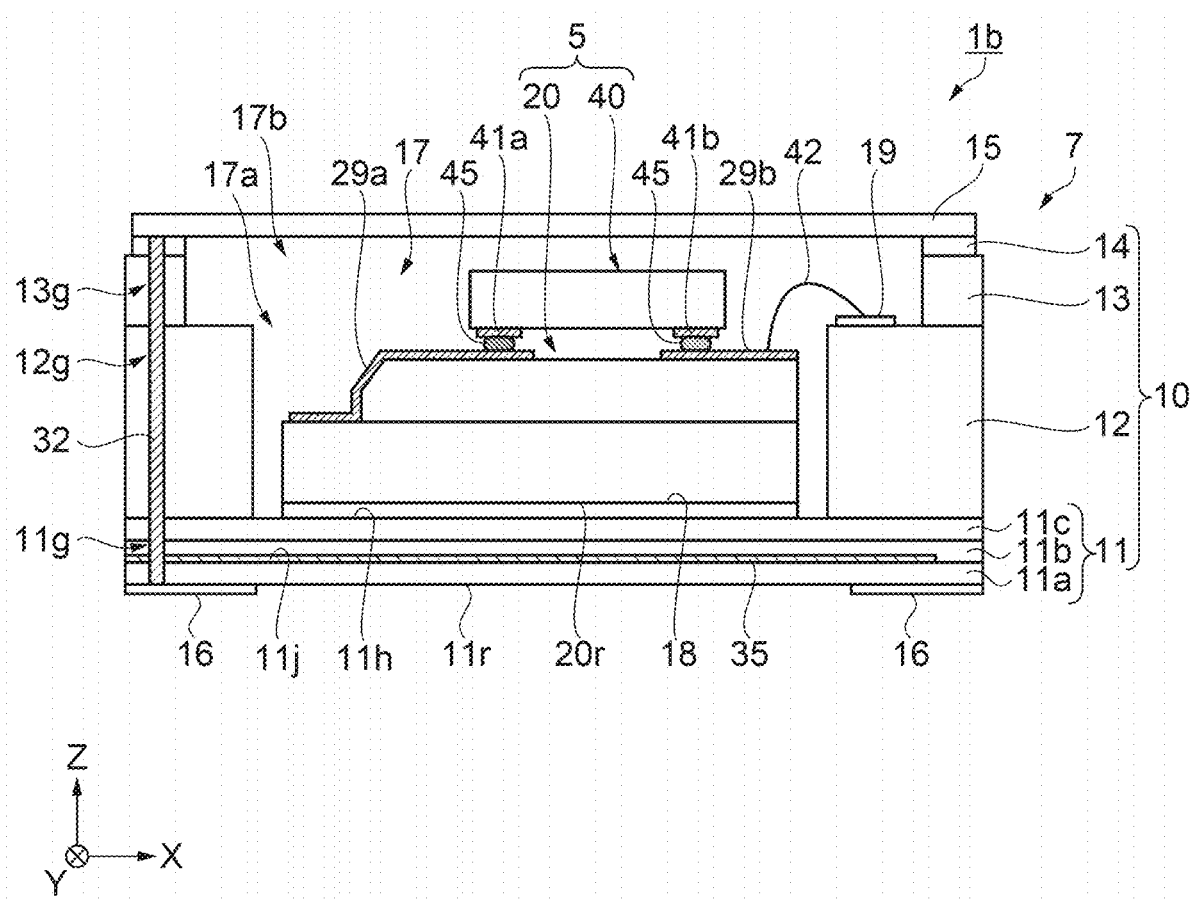
FIG. 13 is a sectional view illustrating a schematic configuration of a physical quantity sensor according to a third embodiment.

Next, with reference to FIG. 13, a description will be made of a physical quantity sensor 1b according to a third embodiment. FIG. 13 is a diagram illustrating a schematic configuration of the physical quantity sensor according to the third embodiment. In the following description, differences from the first embodiment will be focused, and description of the same content will be omitted.

The physical quantity sensor 1b according to the third embodiment is different from the physical quantity sensor 1 according to the first embodiment in terms of a method of mounting the acceleration sensor element 20 and the IC 40 of the structural body 5. The IC 40 of the physical quantity sensor 1 according to the first embodiment is mounted on the acceleration sensor element 20 via the adhesive material 41. In contrast, the IC 40 of the physical quantity sensor 1b according to the third embodiment is bonded to the acceleration sensor element 20 through flip chip packaging using conductive bumps 45.

In the physical quantity sensor 1b of the third embodiment, as illustrated in FIG. 13, electrode pads 41a and 41b provided on the IC 40 are opposed and electrically connected to connection terminals 29a and 29b provided on the acceleration sensor element 20 via the conductive bumps as an electrical connection portion. Therefore, electrical interference with the serial communication wirings (30a, 30b, and 30c) is more suppressed than in the wire bonding connection in the physical quantity sensor 1 of the first embodiment. The electrode pads 41b provided on the IC 40 are electrically connected to the internal terminals 19 via the bonding wires 42 from the connection terminals 29b which are electrically connected thereto via the conductive bumps 45.

According to the physical quantity sensor 1b according to the third embodiment, in the same manner as in the first embodiment, it is possible to reduce residual noise mixing into a signal output from the acceleration sensor element 20 due to electrical interference between the conductive bumps 45 as an electrical connection portion and the serial communication wirings (30a, 30b, and 30c). Regarding an electrical connection method between the acceleration sensor element 20 and the IC 40, the electrode pads 41a which are provided on the IC 40 and easily electrically interferes with the serial communication wirings (30a, 30b, and 30c) are opposed to the acceleration sensor element 20 are electrically connected thereto via the conductive bumps 45, and thus the conductive bumps 45 and the serial communication wirings (30a, 30b, and 30c) interfere with each other even less. Thus, it is possible to further reduce deterioration in sensor measurement characteristics of the physical quantity sensor 1b.

Fourth Embodiment

Physical Quantity Sensor 1c

Figure 14:
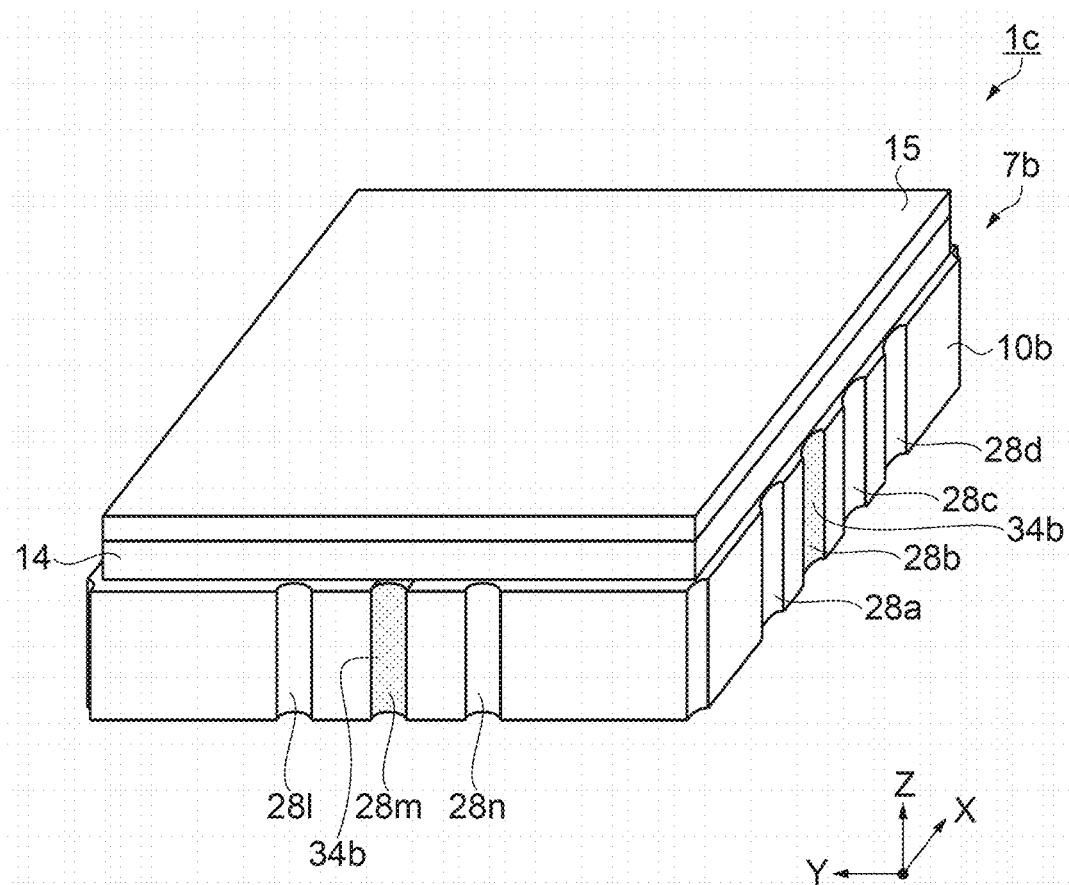
FIG. 14 is a perspective view illustrating a schematic configuration of a physical quantity sensor according to a fourth embodiment.

Next, with reference to FIG. 14, a description will be made of a physical quantity sensor 1c according to a fourth embodiment. FIG. 14 is a diagram illustrating a schematic configuration of the physical quantity sensor according to the fourth embodiment. In the following description, differences from the first embodiment will be focused, and description of the same content will be omitted.

The physical quantity sensor 1c according to the fourth embodiment is different from the physical quantity sensor 1 according to the first embodiment in terms of an electrical connection method between the lid 15 and the GND solid pattern 35 provided on a base portion 10b. The lid 15 and the GND solid pattern 35 of the physical quantity sensor 1 according to the first embodiment are electrically connected to each other via the conductors 32 filling the through-holes 11g, 12g, and 13g which are respectively provided in the first base material 11, the second base material 12, and the third base material 13 and communicate with each other. In contrast, the lid 15 and the GND solid pattern 35 of the physical quantity sensor 1c according to the fourth embodiment are electrically connected to each other via conductive layers 34b formed by metallizing the castellations 28b and 28m provided on side surfaces of the base portion 10b configuring the package 7b with a metal material or the like.

In the physical quantity sensor 1c of the fourth embodiment, as illustrated in FIG. 14, in order to electrically connect the lid 15 to the GND solid pattern 35, the conductive layers 34b formed by metallizing the castellations 28b and 28m provided on the side surfaces of the base portion 10b with a metal material or the like are provided. Therefore, the lid 15 and the GND solid pattern 35 can be caused to have an identical potential, and thus it is possible to reduce the influence of radiation noise from the lid 15 side and the first base material 11 side by using the lid 15 and the GND solid pattern 35.

According to the physical quantity sensor 1c according to the fourth embodiment, in the same manner as in the first embodiment, it is possible to reduce residual noise mixing into a signal output from the acceleration sensor element 20 due to electrical interference between the bonding wires 43 and the serial communication wirings (30a, 30b, and 30c), and thus to reduce deterioration in sensor measurement characteristics of the physical quantity sensor 1c. The lid 15 and the GND solid pattern 35 provided in the base portion 10b are electrically connected to each other via the conductive layers 34b formed on the castellations 28b and 28m, and thus it is possible to reduce the influence of radiation noise from the outside of the package 7b.

Fifth Embodiment

Physical Quantity Sensor 1d

Figure 15:
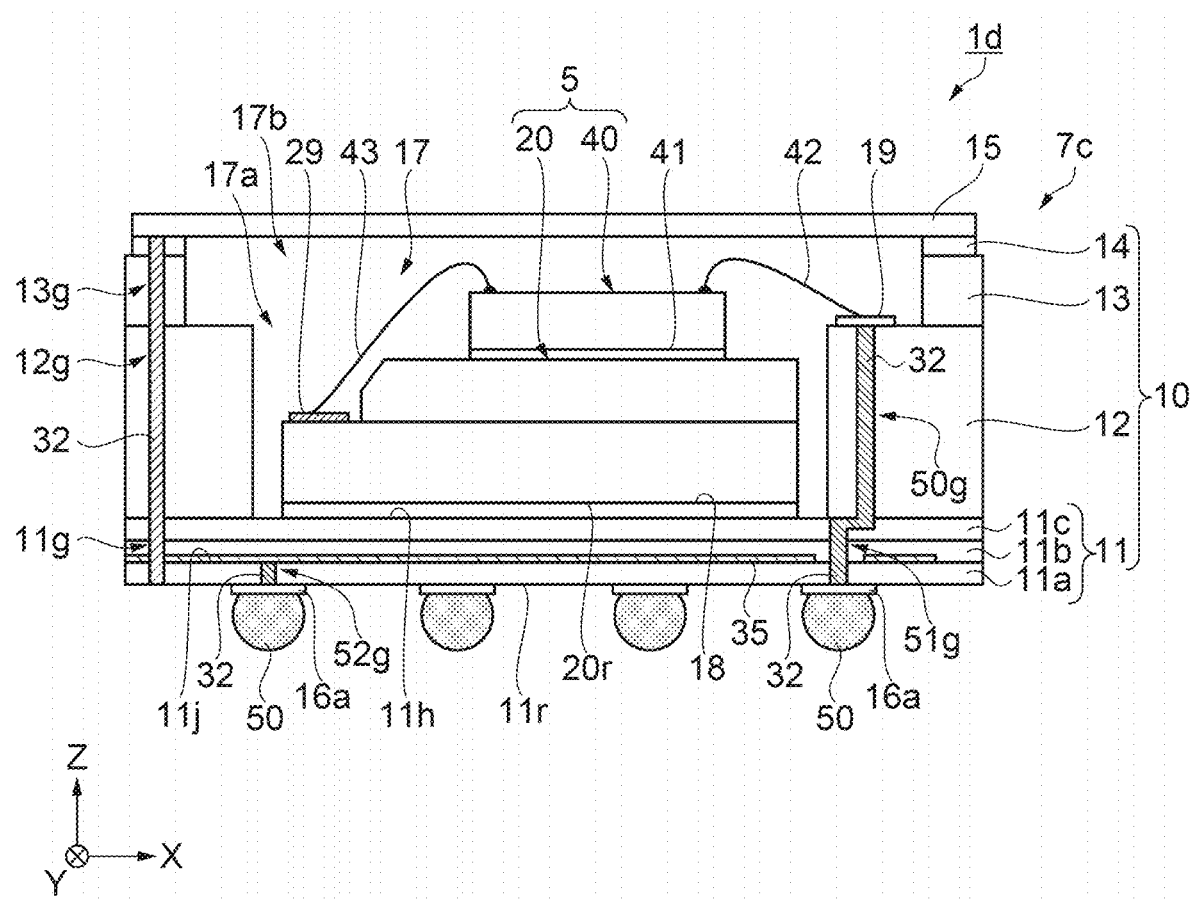
FIG. 15 is a sectional view illustrating a schematic configuration of a physical quantity sensor according to a fifth embodiment.

Next, with reference to FIG. 15, a description will be made of a physical quantity sensor 1d according to a fifth embodiment. FIG. 15 is a diagram illustrating a schematic configuration of the physical quantity sensor according to the fifth embodiment. In the following description, differences from the first embodiment will be focused, and description of the same content will be omitted.

The physical quantity sensor 1d of the fifth embodiment is different from the physical quantity sensor 1 of the first embodiment in that, whereas the plurality of external terminals 16 are disposed to be in contact with the castellations 28a to 28n on the outer bottom surface 11r of the package 7, a plurality of external terminals 16a are disposed on the outer bottom surface 11r, and solder bumps 50 are respectively disposed on the external terminals 16a, in a package 7c of the physical quantity sensor 1d according to the fifth embodiment.

As illustrated in FIG. 15, in the physical quantity sensor 1d of the fifth embodiment, a plurality of external terminals 16a are disposed to be separated from an outer edge of the package 7c on the outer bottom surface 11r of the package 7c, and the solder bumps 50 are respectively disposed on the external terminals 16a. Here, for example, the IC 40 is electrically connected to the external terminals 16a via the internal terminals 19 and the conductors 32 filling through-holes 50g and 51g which penetrate through the first base material 11 and the second base material 12. The GND solid pattern 35 is electrically connected to the external terminal 16a via the conductor 32 filling a through-hole 52g which penetrates through the bottom plate substrate 11a of the first base material 11.

According to the physical quantity sensor 1d according to the fifth embodiment, in the same manner as in the first embodiment, it is possible to reduce residual noise mixing into a signal output from the acceleration sensor element 20 due to electrical interference between the bonding wires 43 and the serial communication wirings (30a, 30b, and 30c) and also to reduce the influence of radiation noise from the outside of the package 7c, and thus to reduce deterioration in sensor measurement characteristics of the physical quantity sensor 1d. A lead wire is not necessary, and thus it is possible to miniaturize the physical quantity sensor 1d.

Inertial Measurement Unit 3000

Next, with reference to FIGS. 16 and 17, a description will be made of an inertial measurement unit (IMU) 3000 to which the physical quantity sensor 1 according to one embodiment is applied.

Figure 16:
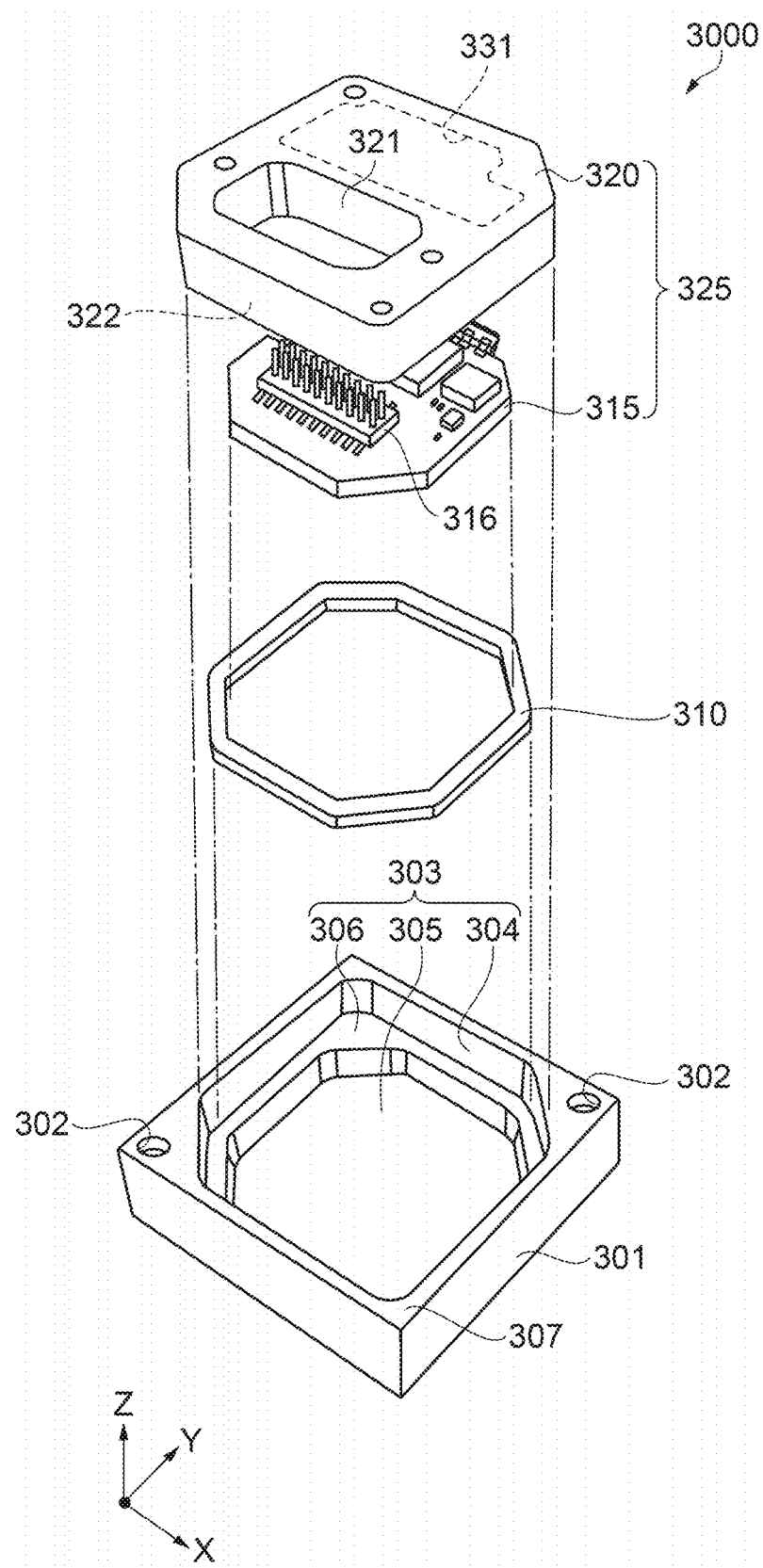
FIG. 16 is an exploded perspective view illustrating a schematic configuration of an inertial measurement unit.
Figure 17:
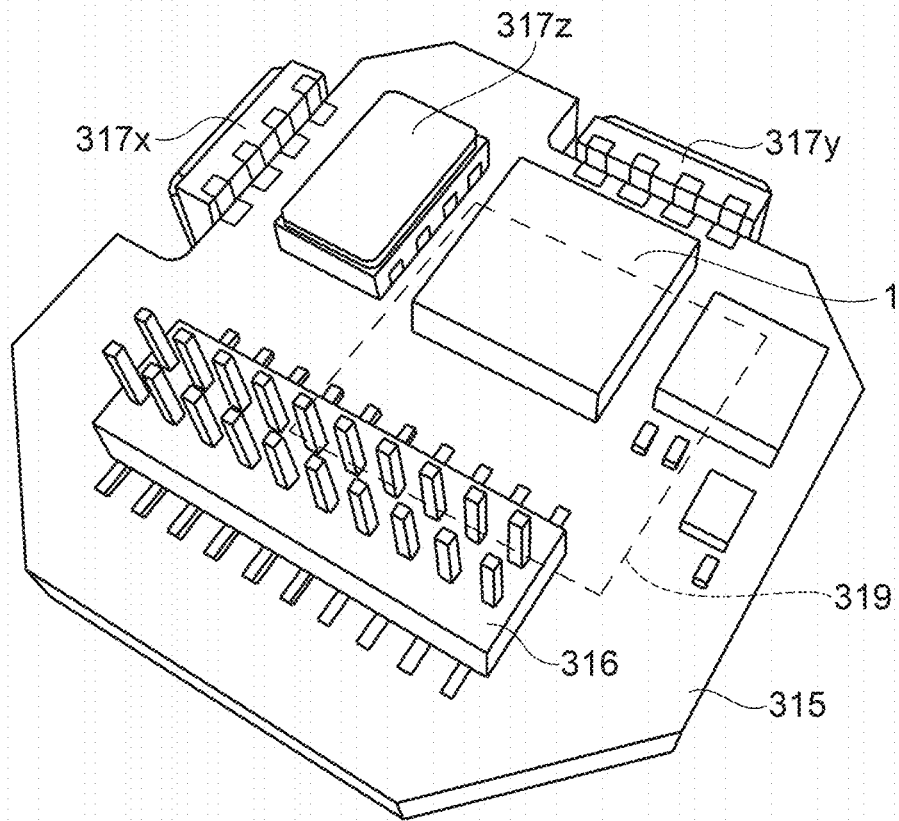
FIG. 17 is a perspective view illustrating a disposition example of an inertial sensor element of the inertial measurement unit.

FIG. 16 is an exploded perspective view illustrating a schematic configuration of the inertial measurement unit, and FIG. 17 is a perspective view illustrating a disposition example of an inertial sensor element of the inertial measurement unit.

As illustrated in FIG. 16, the inertial measurement unit 3000 includes an outer case 301, a bonding member 310, and a sensor module 325 including an inertial sensor element. In other words, the inertial measurement unit 3000 has a configuration in which the sensor module 325 is fitted (inserted) into the inside 303 of the outer case 301 via the bonding member 310. The sensor module 325 has an inner case 320 and a substrate 315. For better understanding of description, the element names are the outer case and the inner case, but may be replaced with a first case and a second case.

The outer case 301 is a pedestal formed into a box shape by grinding an aluminum material. A material thereof is not limited to aluminum, and other metals such as zinc or stainless steel, a resin, or a composite material of metal and resin may be used. An outer shape of the outer case 301 is a cuboidal shape of which a planar shape is a square shape in the same manner as the entire shape of the inertial measurement unit 3000, and the screw holes 302 are formed near two vertexes located in the diagonal direction of the square. There is no limit to the screw holes 302, and, for example, there may be a configuration in which notches (a structure in which notches are formed at corners of the outer case 301 where the screw holes 302 are located) which can be screwed with screws are formed and are screwed, or there may be a configuration in which flanges (ears) are formed on the side surfaces of the outer case 301, and the flange portions are screwed. However, in a case where notch holes are screwed as fixation portions in the former case, and a notch of the notch hole is open wider than a screw diameter, a screw is deviated from the notch so as to be inclined when screwing is performed, and thus there is concern that screwing fixation may be easily released, or the notch hole portion of the outer case may be deformed or scraped by the deviated screw. Thus, in a case where a notch hole is provided as a fixation portion, a notch of the notch hole is preferably smaller than a diameter of a screw.

The outer case 301 of which an outer shape is a cuboidal shape has a box shape without a lid, and the inside 303 thereof is an internal space (container) surrounded by a bottom wall 305 and a sidewall 304. In other words, the outer case 301 has a box shape of which one surface facing the bottom wall 305 is an open surface, and the sensor module 325 is accommodated to cover most of an open part of the open surface (to occupy the open part), so that the sensor module 325 is in a state of being exposed from the open part (not illustrated). Here, the open surface facing the bottom wall 305 is the same as an upper surface 307 of the outer case 301. A planar shape of the inside 303 of the outer case 301 is a hexagonal shape formed by chamfering corners of two vertexes of the square, and the two chamfered vertexes corresponds to the positions of the screw holes 302. In a sectional shape (thickness direction) of the inside 303, a first bonding surface 306 which is higher than a central part by one step at a peripheral edge part is formed on the bottom wall 305 in the inside 303, that is, in the internal space. In other words, the first bonding surface 306, which is a part of the bottom wall 305, is a one-step staircase portion formed in a ring shape surrounding the central part of the bottom wall 305 in a plan view, and is a surface of which is a distance from the open surface (the same as the upper surface 307) is smaller than that of the bottom wall 305.

A description has been made of a case where the outer case 301 is a cuboid of which an outer planar shape is a substantially square shape and has a box shape without a lid, but this is only an example, and an outer planar shape of the outer case 301 may be, for example, a polygonal shape such as a hexagonal shape or an octagonal shape, and may have a planar shape in which a corner of a vertex of the polygonal shape are chamfered, or a corner side is curved. A planar shape of the inside 303 of the outer case 301 is not limited to the above-described hexagonal shape, and may be a rectangular shape (quadrangular shape) such as a square shape, or other polygonal shapes such as a polygonal shape. An outer shape of the outer case 301 and a planar shape of the inside 303 may or not be similar shapes.

The inner case 320 is a member supporting the substrate 315, and has a shape accommodated in the inside 303 of the outer case 301. Specifically, in a plan view, the inner case 320 has a hexagonal shape formed by chamfering corners of two vertexes of the square, and is provided with an opening 321 which is a rectangular through-hole and a depressed portion 331 provided on a surface side supporting the substrate 315. The two chamfered vertexes correspond to the positions of the screw holes 302 of the outer case 301. A height of the inner case 320 in the thickness direction (Z axis direction) is lower than a height from the upper surface 307 of the outer case 301 to the first bonding surface 306. In a preferable example, the inner case 320 is also formed by grinding an aluminum material, but other materials may be used in the same manner as in the outer case 301.

Guide pins for positioning the substrate 315 or support surfaces (none thereof illustrated) are formed on a rear surface (a surface on the outer case 301 side) of the inner case 320. The substrate 315 is set in the guide pins or the support surfaces (positioned and mounted), and is adhered to the rear surface of the inner case 320. Details of the substrate 315 will be described later. A peripheral edge part of the rear surface of the inner case 320 is a second bonding surface 322 formed from a ring-shaped plane. The second bonding surface 322 has the substantially same shape as that of the first bonding surface 306 of the outer case 301 in a plan view, and two surfaces face each other in a state of interposing the bonding member 310 therebetween when the inner case 320 is set in the outer case 301. Structures of the outer case 301 and the inner case 320 are only examples, and are not limited to the structures.

With reference to FIG. 17, a description will be made of a configuration of the substrate 315 mounted with an inertial sensor. As illustrated in FIG. 17, the substrate 315 is a multi-layer substrate in which a plurality of through-holes are formed, and employs a glass epoxy substrate. There is no limit to a glass epoxy substrate, and a rigid substrate on which a plurality of inertial sensors, electronic components, connectors, and the like can be mounted may be used. For example, a composite substrate or a ceramic substrate may be used.

A connector 316, an angular velocity sensor 317z, the physical quantity sensor 1 as an acceleration sensor, and the like are mounted on a front surface (a surface on the inner case 320 side) of the substrate 315. The connector 316 is a plug type (male) connector, and includes connection terminals in two lines arranged at an equal pitch in the X axis direction. Preferably, a total of 20 contact terminals including 10 pins in each line, but the number of terminals may be changed as appropriate depending on a design specification.

The angular velocity sensor 317z as an inertial sensor is a gyro sensor measuring an angular velocity of one axis in the Z axis direction. In a preferable example, a vibration gyro sensor which measures an angular velocity on the basis of Coriolis force applied to a vibrating object by using quartz crystal as a vibrator. There is no limit to a vibration gyro sensor, and a sensor which can measure an angular velocity may be used. For example, a sensor using a ceramic or silicon as a vibrator may be used.

An angular velocity sensor 317x measuring an angular velocity of one axis in the X axis direction is mounted on a side surface of the substrate 315 in the X axis direction such that a mounting surface is perpendicular to the X axis.

Similarly, an angular velocity sensor 317y measuring an angular velocity of one axis in the Y axis direction is mounted on a side surface of the substrate 315 in the Y axis direction such that a mounting surface is perpendicular to the Y axis.

There is no limit to a configuration in which the three angular velocity sensors of the respective axes are used, and a sensor which can measure three-axis angular velocities may be used. For example, a sensor device which can measure (sense) three-axis angular velocities with a single device (package) may be used, such as the physical quantity sensor 1 which will be described later.

The same physical quantity sensor 1 as that described in the first embodiment can measure (sense) accelerations in three directions of the X axis, the Y axis, and the Z axis with a single device, and has a configuration in which the electrostatic capacitance type acceleration sensor element 20 (refer to FIG. 6, for example) into which a silicon substrate is processed according to a MEMS technique is bonded to the package 7 (refer to FIG. 3) by using the resin adhesive material 18 (refer to FIG. 3).

A control IC 319 as a control unit controlling the physical quantity sensor 1 and the three angular velocity sensors 317x, 317y, and 317z is mounted on the rear surface (the surface on the outer case 301 side) of the substrate 315. The control IC 319 is a micro controller unit (MCU), has a storage section including a nonvolatile memory or an A/D conversion device built thereinto, and controls each element of the inertial measurement unit 3000. The storage section stores a program for defining an order and contents for measuring acceleration and angular velocity, a program for digitalizing measured data to be incorporated into packet data, accompanying data, and the like. A plurality of other electronic components are mounted on the substrate 315.

According to the inertial measurement unit 3000, since the physical quantity sensor 1 of the first embodiment in which the acceleration sensor element 20 is mounted in the package 7 (refer to FIG. 3) is used, residual noise is hardly mixed into a signal output from the acceleration sensor element 20, and thus it is possible to reduce deterioration in sensor measurement characteristics and also to provide the more highly accurate inertial measurement unit 3000.

Electronic Apparatuses (1100, 1200, and 1300)

Next, with reference to FIGS. 18, 19, and 20, a description will be made of electronic apparatuses to which the physical quantity sensor 1 according to one embodiment is applied.

First, a description will be made of a mobile type personal computer 1100 which is an example of an electronic apparatus with reference to FIG. 18. FIG. 18 is a perspective view schematically illustrating a configuration of a mobile type personal computer which is an example of an electronic apparatus.

Figure 18:
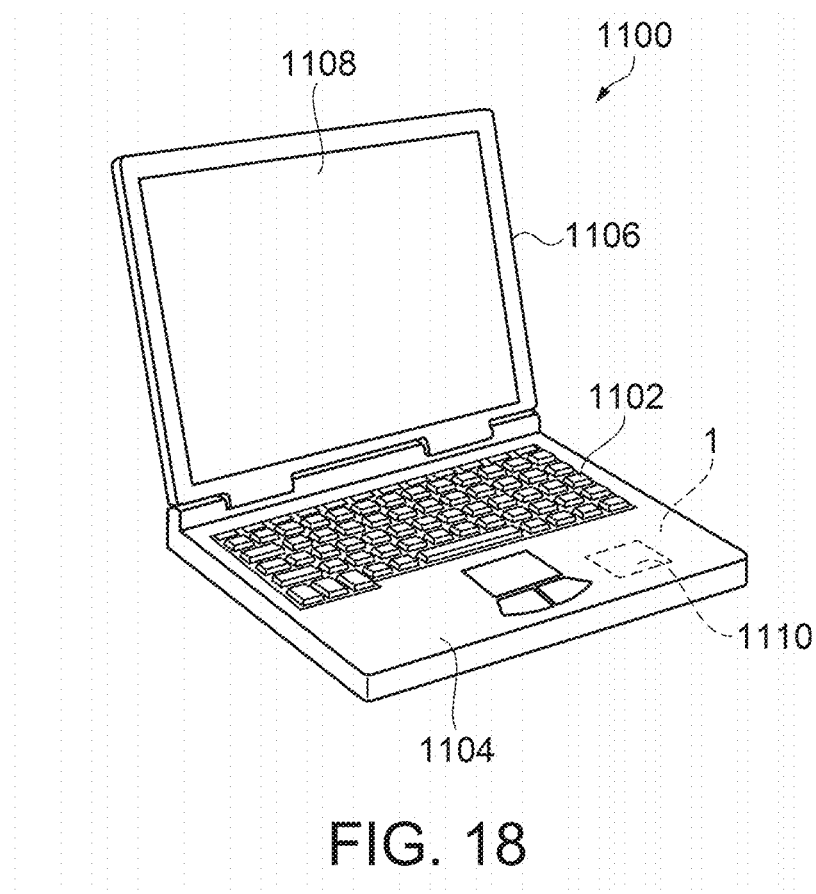
FIG. 18 is a perspective view schematically illustrating a configuration of a mobile type personal computer which is an example of an electronic apparatus.

In FIG. 18, the personal computer 1100 is configured with a main body section 1104 including a keyboard 1102 and a display unit 1106 including a display section 1108, and the display unit 1106 is rotatably supported with respect to the main body section 1104 via a hinge structure section. The physical quantity sensor 1 which functions as an acceleration sensor is built into the personal computer 1100, and a control section 1110 may perform control such as posture control on the basis of measured data in the physical quantity sensor 1. The personal computer 1100 includes a temperature sensor (not illustrated) and a correction section (not illustrated) performing temperature correction on a measurement signal which is measured by the physical quantity sensor 1, and can thus perform control such as posture control with higher accuracy.

Next, a description will be made of a smart phone (mobile phone) 1200 which is an example of an electronic apparatus with reference to FIG. 19. FIG. 19 is a perspective view schematically illustrating a configuration of a smart phone (mobile phone) which is an example of an electronic apparatus.

Figure 19:
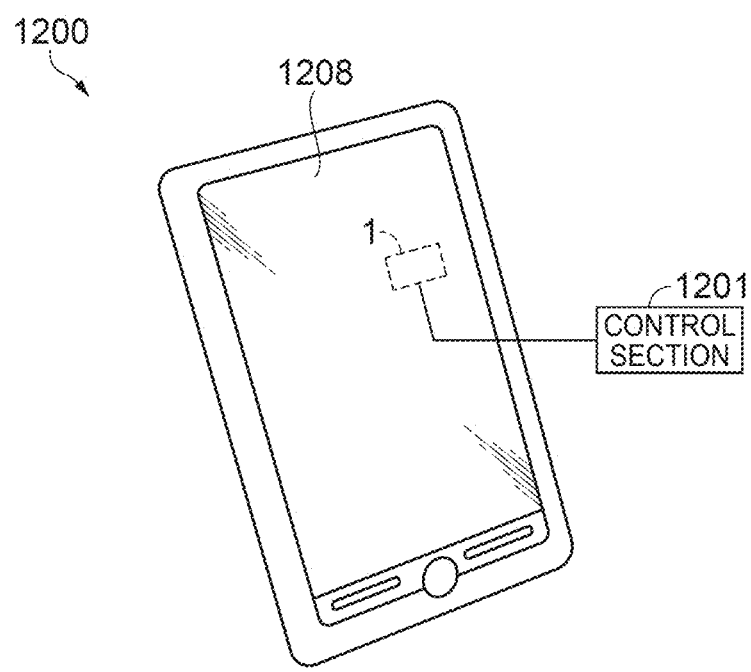
FIG. 19 is a perspective view schematically illustrating a configuration of a smart phone (mobile phone) which is an example of an electronic apparatus.

In FIG. 19, the physical quantity sensor 1 is incorporated into the smart phone 1200. A measurement signal (acceleration data) measured by the physical quantity sensor 1 is transmitted to a control section 1201 of the smart phone 1200. The control section 1201 is configured to include a central processing unit (CPU), and may recognize a posture or a behavior of the smart phone 1200 so as to change a display image displayed on a display section 1208, to make a warning sound or an sound effect, or to cause a main body to vibrate by driving a drive motor.

In other words, a display content may be changed, or a sound or vibration may be generated on the basis of a measured posture or behavior by sensing motion of the smart phone 1200. Particularly, in a case where a game application is executed, it is possible to enjoy the feeling of presence close to reality. The smart phone 1200 includes a temperature sensor (not illustrated) and a correction section (not illustrated) performing temperature correction on a measurement signal which is measured by the physical quantity sensor 1, and can thus perform control such as posture control with higher accuracy.

Next, a description will be made of a digital still camera 1300 which is an example of an electronic apparatus with reference to FIG. 20. FIG. 20 is a perspective view schematically illustrating a configuration of a digital still camera which is an example of an electronic apparatus. FIG. 20 also briefly illustrates connection to external apparatuses.

A display section 1310 is provided on a rear surface of a case (body) 1302 of the digital still camera 1300. The display section 1310 performs display on the basis of an imaging signal generated by a CCD, and functions as a view finder which displays a subject as an electronic image. A light reception unit 1304 which includes an optical lens (imaging optical system), a CCD, and the like is provided on a front surface side (the rear surface side in FIG. 20) of the case 1302.

When a photographer confirms a subject image displayed on the display section 1310 and presses a shutter button 1306, an imaging signal of the CCD at this point is transmitted to and stored in a memory 1308. In the digital still camera 1300, video signal output terminals 1312 and input and output terminals for data communication 1314 are provided on a side surface of the case 1302. As illustrated, the video signal output terminals 1312 are connected to a television monitor 1330, and the input and output terminals for data communication 1314 are connected to a personal computer 1340, as necessary. The imaging signal stored in the memory 1308 is output to the television monitor 1330 or the personal computer 1340. The physical quantity sensor 1 which functions as an acceleration sensor is built into the digital still camera 1300, and a control section 1316 may perform control such as camera shaking correction on the basis of measured data in the physical quantity sensor 1. The digital still camera 1300 includes a temperature sensor (not illustrated) and a correction section (not illustrated) performing temperature correction on a measurement signal which is measured by the physical quantity sensor 1, and can thus perform control such as posture control with higher accuracy.

The electronic apparatuses include the physical quantity sensor 1, the control sections 1110, 1201, and 1316, and the correction sections (not illustrated), and thus have more highly accurate posture control characteristics.

Figure 20:
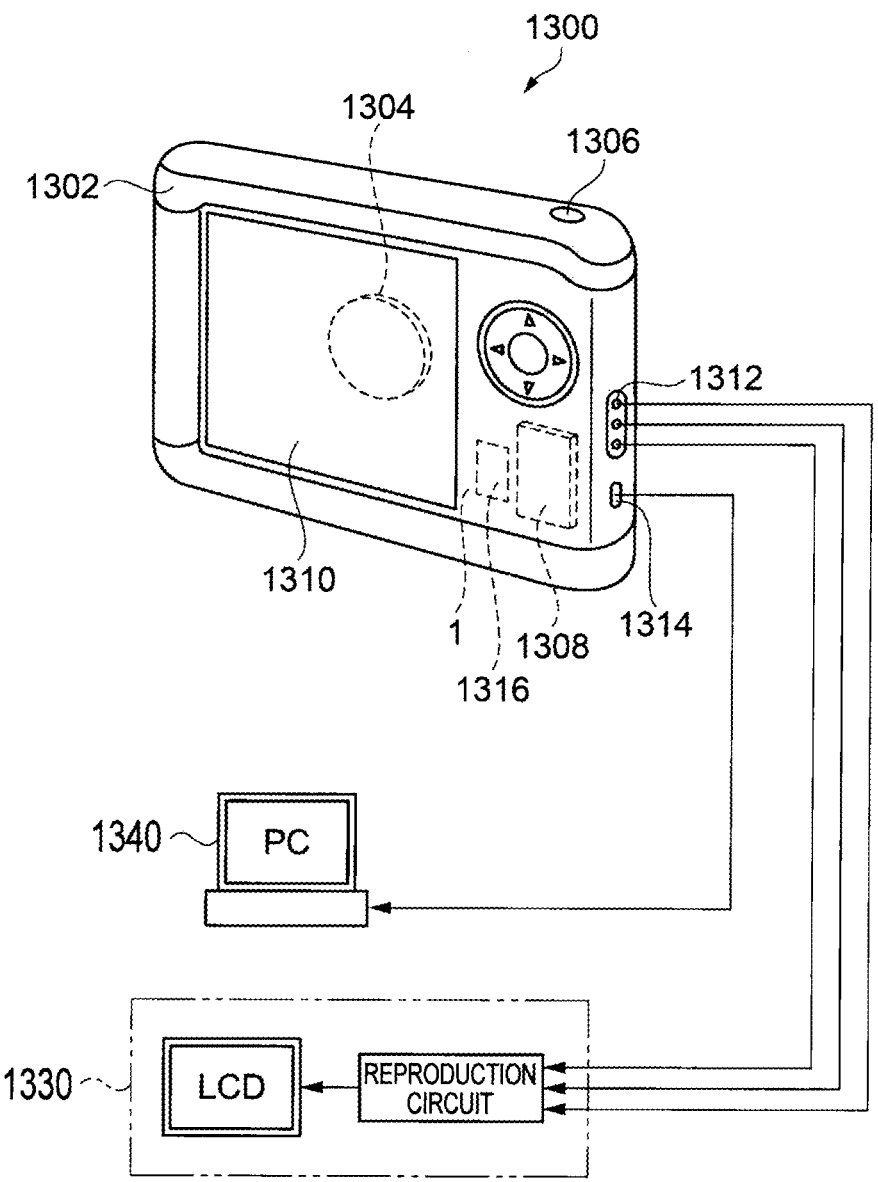
FIG. 20 is a perspective view illustrating a configuration of a digital still camera which is an example of an electronic apparatus.

An electronic apparatus including the physical quantity sensor 1 is applicable not only to the personal computer in FIG. 18, the smart phone (mobile phone) in FIG. 19, and the digital still camera in FIG. 20 but also to, for example, a tablet terminal, a watch, an ink jet type ejection apparatus (for example, an ink jet printer), a laptop type personal computer, a television set, a video camera, a video tape recorder, a car navigation apparatus, a pager, an electronic organizer (including a communication function), an electronic dictionary, an electronic calculator, an electronic gaming machine, a word processor, a workstation, a videophone, a security television monitor, electronic binoculars, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, a seismometer, a pedometer, a vibrometer measuring vibration of a hard disk, a posture control device of a robot or a flying object such as a drone, and a control apparatus used for inertial navigation for automatic driving of a car.

Portable Electronic Apparatus (1400)

Figure 21A:
FIG. 21A is a plan view illustrating a configuration of an activity meter which is an example of a portable electronic apparatus.
Figure 21B:
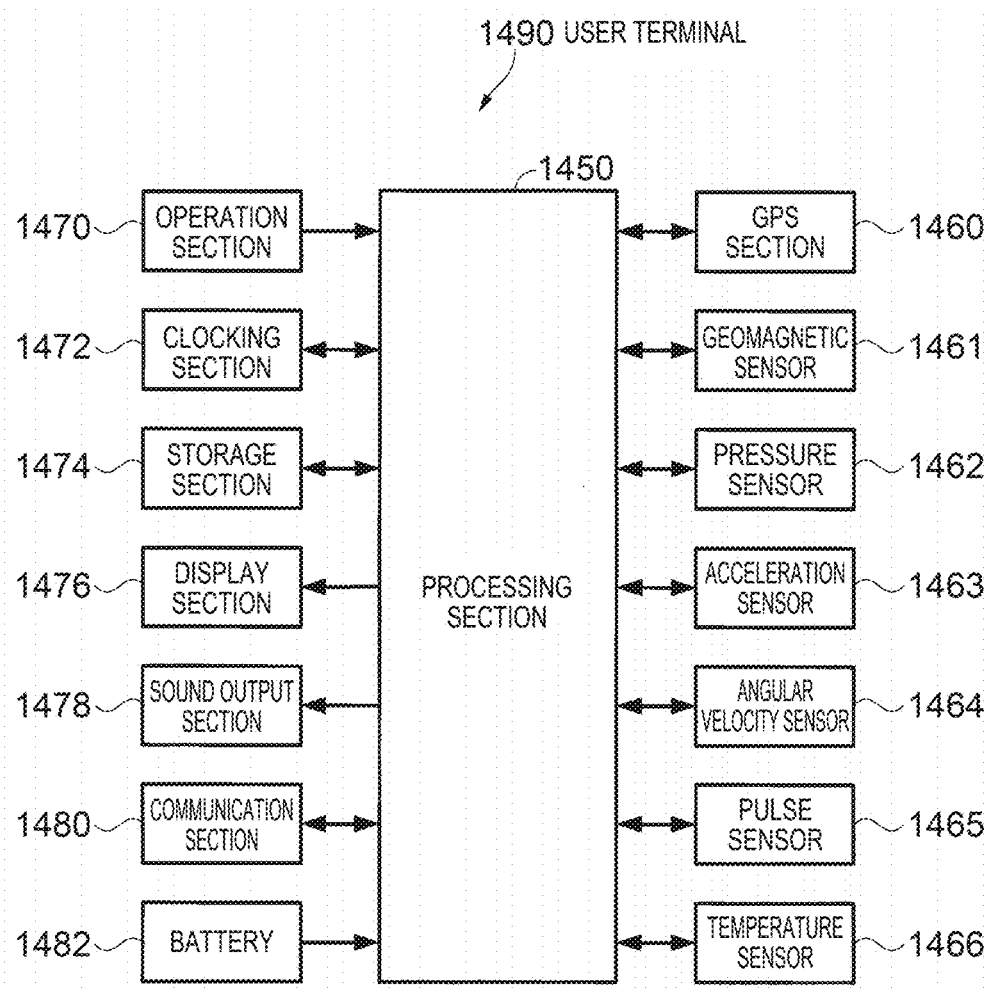
FIG. 21B is a functional block diagram for explaining a function of the activity meter which is an example of a portable electronic apparatus.

Next, a description will be made of a portable electronic apparatus (1400) to which the physical quantity sensor 1 according to one embodiment is applied with reference to FIGS. 21A and 21B. FIG. 21A is a plan view schematically illustrating a configuration of the portable electronic apparatus. FIG. 21B is a functional block diagram illustrating a schematic configuration of the portable electronic apparatus.

Hereinafter, as an example of the portable electronic apparatus, a wrist apparatus 1400 which is a wristwatch type activity meter (activity tracker) will be described.

As illustrated in FIG. 21A, the wrist apparatus 1400 is mounted on a part (subject) such as a user's wrist via bands 1432 and 1437, includes a display section 1476 performing digital display, and can perform wireless communication. The physical quantity sensor 1 according to the present disclosure is incorporated into the wrist apparatus 1400, as a sensor measuring angular velocity.

The wrist apparatus 1400 includes a case 1430 in which at least the physical quantity sensor 1 is accommodated, a processing section 1450 (refer to FIG. 21B) which is accommodated in the case 1430 and processes data output from the physical quantity sensor 1, a display section 1476 which is accommodated in the case 1430, and a light transmissive cover 1471 which closes an opening of the case 1430. A bezel 1477 is provided outside the light transmissive cover 1471 of the case 1430. A plurality of operation buttons 1479 and 1481 are provided on a side surface of the case 1430.

Next, a function of the wrist apparatus 1400 will be described with reference to FIG. 21B.

As illustrated in FIG. 21B, the processing section (processor) 1450 is configured with, for example, a micro processing unit (MPU), a digital signal processor (DSP), or an application specific integrated circuit (ASIC). The processing section 1450 performs various processes on the basis of a program stored in a storage section 1474 and a signal which is input from an operation section 1470. The processes in the processing section 1450 include, for example, a data process on an output signal from each of a GPS sensor 1460, a geomagnetic sensor 1461, a pressure sensor 1462, an acceleration sensor 1463, an angular velocity sensor 1464, a pulse sensor 1465, a temperature sensor 1466, and a clocking section 1472, a display process of displaying an image on the display section 1476, a sound output process of outputting sounds from a sound output section 1478, a communication process of performing communication with a user terminal 1490 via the communication section 1480, and a power control process of supplies power to each section from a battery 1482.

The communication section 1480 is configured to include a transceiver conforming to a short-range radio communication standard such as Bluetooth (registered trademark) (including Bluetooth Low Energy (BTLE)), Wireless Fidelity (Wi-Fi) (registered trademark), Zigbee (registered trademark), near field communication (NFC), or ANT+ (registered trademark), and a connector conforming to a communication bus standard such as Universal Serial Bus (USB).

The acceleration sensor 1463 as the physical quantity sensor 1 according to the present disclosure measures respective accelerations in three axial directions which intersect (ideally, orthogonal to) each other, and outputs signals (acceleration signal) corresponding to magnitudes and directions of the measured three-axis accelerations.

The angular velocity sensor 1464 as the physical quantity sensor 1 according to the present disclosure measures respective angular velocities in three axial directions which intersect (ideally, orthogonal to) each other, and outputs signals (angular velocity signals) corresponding to magnitudes and directions of the measured three-axis angular velocities.

The wrist apparatus 1400 which is a wristwatch type activity meter (activity tracker) has at least the following functions.

Distance: A total distance is measured from measurement starting by using a highly accurate GPS function.

Pace: The current traveling pace is displayed through pace distance measurement.

Average speed: An average speed is calculated from average speed traveling starting to the current time, and is displayed.

Elevation: Elevation is measured and displayed by using the GPS function.

Stride: Strides are measured even in a tunnel or the like which GPS electric waves do not reach, and are displayed.

Pitch: The number of steps per minute is measured and displayed.

Pulse rate: A pulse rate is measured by using the pulse sensor, and is displayed.

Gradient: A gradient of the ground is measured and displayed in training or trailing in a mountainous region.

Auto lap: Lap measurement is automatically performed in a case where a user runs a predetermined distance or a predetermined time set in advance.

Motion calorie consumption: Calorie consumption is displayed.

Number of steps: A sum of the number of steps from motion starting is displayed.

In the above description, a global positioning system (GPS) has been described as a satellite positioning system, but other global navigation satellite systems (GNSS) may be used. For example, one, or two or more satellite positioning systems such as a European geostationary-satellite navigation overlay service (EGNOS), a quasi zenith satellite system (QZSS), a global navigation satellite system (GLONASS), GALILEO, and a Beidou navigation satellite system (BeiDou) may be used. As at least one of the satellite positioning systems, a satellite-based augmentation system (SBAS) such as a wide area augmentation system (WAAS) or a European geostationary-satellite navigation overlay service (EGNOS) may be used.

Vehicle (1500)

Figure 22:
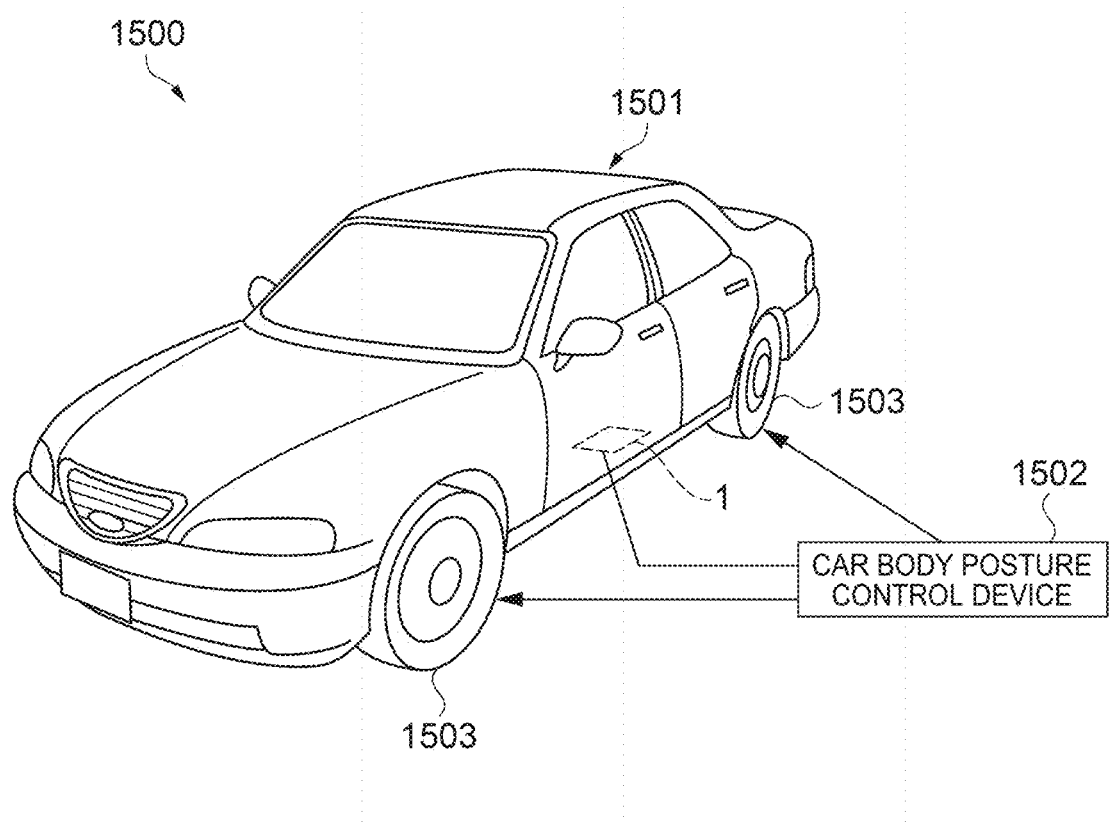
FIG. 22 is a perspective view illustrating a configuration of an automobile which is an example of a vehicle.

Next, a description will be made of a vehicle (1500) to which the physical quantity sensor 1 according to one embodiment is applied with reference to FIG. 22. FIG. 22 is a perspective view illustrating a configuration of an automobile which is an example of a vehicle.

As illustrated in FIG. 22, the physical quantity sensor 1 is built into an automobile 1500, and, for example, a posture of a car body 1501 may be detected by the physical quantity sensor 1. A measurement signal from the physical quantity sensor 1 is supplied to a car body posture control device 1502 as a posture control section. The car body posture control device 1502 may detect a posture of the car body 1501 on the basis of the signal, and may control hardness and softness of a suspension or control brakes of wheels 1503 according to a detection result. The physical quantity sensor 1 is widely applicable to electronic control units (ECUs) such as a keyless entry, an immobilizer, a car navigation system, a car air conditioner, an antilock brake system (ABS), an air bag, a tire pressure monitoring system (TPMS), engine control, a control apparatus of inertial navigation for automatic driving, and a battery monitor of a hybrid car or an electric car.

The physical quantity sensor 1 applied to a vehicle may be used for, for example, posture control of a bipedal robot or an electric train, remote control of a radio control airplane, a radio control helicopter, and a drone or posture control of an autonomous flying object, and posture control of an agricultural machine or a construction machine. As mentioned above, in order to realize posture control of various vehicles, the physical quantity sensor 1 and the posture control section (not illustrated) are incorporated thereinto.

The vehicles include the physical quantity sensor 1 and the posture control sections (not illustrated), and thus have more highly accurate posture control characteristics.

As mentioned above, although the physical quantity sensors 1, 1*a*, 1*b*, 1*c*, and 1*d*, the inertial measurement unit 3000, the electronic apparatuses (1100, 1200, and 1300), the portable electronic apparatus (1400), and the vehicle (1500) according to the embodiments have been described in detail, the invention is not limited thereto, and a configuration of each part may be replaced with any configuration having the same function. Any other configuration may be added to the invention.

In the above-described embodiments, a description has been made of a configuration in which the acceleration sensor element has three sensor portions, but the number of sensor portions is not limited thereto, and may be one or two, or four or more. In the above-described embodiments, the acceleration sensor element is used as a sensor element of the physical quantity sensor, but a sensor element of the physical quantity sensor is not limited to an acceleration sensor element, and may be, for example, a pressure sensor element or an angular velocity sensor element. For example, a composite sensor which can simultaneously measure different physical quantities such as acceleration and angular velocity may be used.

The entire disclosure of Japanese Patent Application No. 2018-011309 filed Jan. 26, 2018 is expressly incorporated herein by reference.

What is claimed is:

1. A physical quantity sensor comprising:
   a substrate;
   a sensor element mounted on the substrate;

a semiconductor circuit mounted on the sensor element so as to sandwich the sensor element between the substrate and the semiconductor circuit;

serial communication wirings provided on the substrate; and electrical connectors connecting the sensor element to the semiconductor circuit, and arranged on a side opposite to the serial communication wirings in a lateral direction of the sensor element.

2. The physical quantity sensor according to claim 1, wherein, in the plan view, ground wiring is provided on the opposite side.

3. The physical quantity sensor according to claim 2, wherein the ground wiring is provided on the substrate.

4. The physical quantity sensor according to claim 1, wherein the serial communication wirings include a Master In Slave Out wiring, a Master Out Slave In wiring, and a Serial Clock wiring.

5. The physical quantity sensor according to claim 1, wherein the serial communication wirings are electrically connected to terminals provided a surface of the substrate opposite the sensor element by way of conductors filling through-holes penetrating through the substrate.

6. The physical quantity sensor according to claim 1, wherein the sensor element and the semiconductor circuit are connected to each other through flip chip packaging.

7. The physical quantity sensor according to claim 1, further comprising:

a ground solid pattern that is separated from a surface of the substrate on which the sensor element is mounted.

8. The physical quantity sensor according to claim 7, wherein the ground solid pattern completely overlaps the sensor element.

9. The physical quantity sensor according to claim 7, wherein the substrate is a stacked substrate including a plurality of substrates that are stacked on each other.

10. The physical quantity sensor according to claim 9, wherein the plurality of substrates consists of three substrates.

11. The physical quantity sensor according to claim 7, further comprising:

an annular substrate that is stacked on the surface of the substrate on which the sensor element is mounted, the annular substrate circumferentially surrounding the sensor element and the semiconductor circuit; and a conductive lid that seals an opening of a recess formed by the substrate and the annular substrate to form a closed space.

12. The physical quantity sensor according to claim 11, wherein the lid and the ground solid pattern are electrically connected to each other by at least one of:

conductive pathways formed in castellations provided on side surfaces of the substrate and the annular substrate; or conductors filling through holes penetrating through the annular substrate.

13. The physical quantity sensor according to claim 1, wherein, among a plurality of wirings formed on the substrate, a width of an analog wiring is larger than a width of a signal wiring.

14. The physical quantity sensor according to claim 13, wherein, L1 is a width of the analog wiring, L2 is a width of the signal wiring, and $L1/L2 \geq 2$.

15. An electronic apparatus comprising the physical quantity sensor according to claim 1.

16. An electronic apparatus comprising the physical quantity sensor according to claim 2.

17. An electronic apparatus comprising the physical quantity sensor according to claim 3.

18. A vehicle comprising the physical quantity sensor according to claim 1.

19. A vehicle comprising the physical quantity sensor according to claim 2.

20. A vehicle comprising the physical quantity sensor according to claim 3.

\* \* \* \* \*